United States Patent
Kawabata et al.

(10) Patent No.: US 10,021,321 B2
(45) Date of Patent: Jul. 10, 2018

(54) IMAGING DEVICE AND IMAGING SYSTEM

(71) Applicant: CANON KABUSHIKI KAISHA, Tokyo (JP)

(72) Inventors: Kazunari Kawabata, Mitaka (JP); Masahiro Kobayashi, Tokyo (JP); Yusuke Onuki, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/601,620

(22) Filed: May 22, 2017

(65) Prior Publication Data

US 2017/0359539 A1    Dec. 14, 2017

(30) Foreign Application Priority Data

Jun. 10, 2016  (JP) .................................. 2016-115946

(51) Int. Cl.
  *H04N 5/355*    (2011.01)
  *H04N 5/369*    (2011.01)
  (Continued)

(52) U.S. Cl.
  CPC ........... *H04N 5/35554* (2013.01); *G02B 7/34* (2013.01); *H04N 5/3696* (2013.01); *H04N 5/378* (2013.01)

(58) Field of Classification Search
  CPC .... H04N 5/369; H04N 5/238; H04N 5/35554; H04N 5/3696; H04N 5/378; H04N 5/361;
  (Continued)

(56) References Cited

U.S. PATENT DOCUMENTS 7,227,208 B2    6/2007  Ogura et al. .................. 257/292
7,462,810 B2   12/2008  Kobayashi et al. ....... 250/208.1
(Continued)

FOREIGN PATENT DOCUMENTS

JP    2015-201834    11/2005
JP    2011-040543    2/2011
JP    2011-091367    5/2011

OTHER PUBLICATIONS

U.S. Appl. No. 15/467,919, filed Mar. 23, 2017.
(Continued)

*Primary Examiner* — Pritham Prabhakher
(74) *Attorney, Agent, or Firm* — Fitzpatrick, Cella, Harper & Scinto

(57) ABSTRACT

An imaging device includes pixels each including first and second photoelectric conversion units on which pupil-divided parts of incident light are incident and a holding unit that holds charges transferred from the first and second photoelectric conversion units, and outputting signals based on amounts of charges held by the holding unit. Each pixel outputs a first signal and a second signal based on amounts of charges generated by the first photoelectric conversion unit and by the first and second photoelectric conversion units, respectively, during a first exposure time, and a third signal and a fourth signal based on amounts of charges generated by the first photoelectric conversion unit and by the first and second photoelectric conversion units, respectively, during a second exposure time. The first and second signals are output before the third and fourth signals in one frame and after the third and fourth signals in another frame.

20 Claims, 22 Drawing Sheets

(51) Int. Cl.
*H04N 5/378* (2011.01)
*G02B 7/34* (2006.01)

(58) Field of Classification Search
CPC .......... H04N 5/37452; H04N 5/35563; H04N 5/2254; H04N 5/23212; H04N 5/37457; H04N 5/3559; H04N 5/2353; H04N 5/353; H04N 5/374; H04N 5/3535; H04N 5/3765; H04N 5/35572; H04N 5/3575; H04N 5/3742; G02B 7/34; G02B 27/0012; G02B 3/0043; G02B 3/0056; H01L 27/1463; H01L 27/14603; H01L 27/14612; H01L 27/14623; H01L 27/14625; H01L 27/14629; H01L 27/14643; H01L 27/1461; H01L 27/14627; H01L 27/14621; H01L 27/14645; H01L 27/146; H01L 27/14638; H01L 27/14641; H01L 27/14614; H01L 27/14609; G06T 5/20
USPC ..................................................... 348/230.1
See application file for complete search history.

(56) References Cited

U.S. PATENT DOCUMENTS

| | | | |
|---|---|---|---|
| 7,561,199 B2 | 7/2009 | Noda et al. | 348/308 |
| 7,719,587 B2 | 5/2010 | Ogura et al. | 348/302 |
| 7,928,477 B2 | 4/2011 | Kobayashi et al. | 257/225 |
| 7,935,995 B2 | 5/2011 | Watanabe et al. | 257/292 |
| 8,045,034 B2 | 10/2011 | Shibata et al. | 348/308 |
| 8,063,351 B2 | 11/2011 | Kobayashi et al. | 250/208.1 |
| 8,115,848 B2 | 2/2012 | Onuki et al. | 348/308 |
| 8,174,604 B2 | 5/2012 | Shibata et al. | 348/308 |
| 8,222,682 B2 | 7/2012 | Watanabe et al. | 257/292 |
| 8,259,205 B2 | 9/2012 | Noda et al. | 348/308 |
| 8,259,206 B1 | 9/2012 | Shibata et al. | 348/308 |
| 8,289,432 B2 | 10/2012 | Shibata et al. | 348/308 |
| 8,357,956 B2 | 1/2013 | Kobayashi et al. | 257/225 |
| 8,427,564 B2 | 4/2013 | Yamashita et al. | 348/294 |
| 8,456,559 B2 | 6/2013 | Yamashita et al. | 348/308 |
| 8,466,401 B2 | 6/2013 | Arishima et al. | 250/208.1 |
| 8,552,353 B2 | 10/2013 | Kobayashi et al. | 250/208.1 |
| 8,723,232 B2 | 5/2014 | Kobayashi et al. | 257/225 |
| 8,736,734 B2 | 5/2014 | Onuki et al. | 348/308 |
| 8,884,391 B2 | 11/2014 | Fudaba et al. | 257/432 |
| 8,952,433 B2 | 2/2015 | Inui | 257/292 |
| 9,147,708 B2 | 9/2015 | Okita et al. | H01L 27/1461 |
| 9,153,610 B2 | 10/2015 | Kobayashi et al. | H04N 5/378 |
| 9,276,027 B2 | 3/2016 | Okita et al. | H01L 27/14812 |
| 9,344,653 B2 | 5/2016 | Shimotsusa et al. | H01L 27/14623 |
| 9,419,038 B2 | 8/2016 | Kobayashi et al. | H01L 27/14612 |
| 9,445,026 B2 | 9/2016 | Kobayashi et al. | H01L 27/14636 |
| 9,491,442 B2* | 11/2016 | Kim | H04N 5/3535 |
| 9,538,112 B2 | 1/2017 | Wada et al. | H04N 5/378 |
| 9,548,328 B2 | 1/2017 | Hasegawa et al. | H01L 27/1464 |
| 9,711,553 B2* | 7/2017 | Kim | H01L 27/14609 |
| 9,716,849 B2 | 7/2017 | Kobayashi et al. | H01L 27/14612 |
| 9,883,128 B2* | 1/2018 | Banachowicz | H04N 5/355 |
| 9,905,604 B2* | 2/2018 | Murata | H01L 27/14645 |
| 2011/0031576 A1 | 2/2011 | Iwasa et al. | 257/440 |
| 2013/0206965 A1 | 8/2013 | Yamashita et al. | 250/208.1 |
| 2014/0061436 A1 | 3/2014 | Kobayashi | 250/208.1 |
| 2015/0062367 A1 | 3/2015 | Inui | 348/222.1 |
| 2015/0264283 A1 | 9/2015 | Kobayashi et al. | H01L 27/1463 |
| 2015/0281614 A1 | 10/2015 | Yoshida et al. | H04N 5/3745 |
| 2015/0312557 A1* | 10/2015 | Kim | H04N 5/3535 348/46 |
| 2016/0071896 A1 | 3/2016 | Kawabata et al. | H01L 27/14621 |
| 2016/0071902 A1 | 3/2016 | Okita et al. | H01L 27/14625 |
| 2016/0141326 A1* | 5/2016 | Hanzawa | H01L 27/14603 250/208.1 |
| 2016/0219238 A1 | 7/2016 | Tsuboi | H01L 27/14623 |
| 2016/0227139 A1 | 8/2016 | Shimotsusa et al. | H01L 27/14627 |
| 2016/0286108 A1* | 9/2016 | Fettig | H04N 5/2355 |
| 2016/0322406 A1 | 11/2016 | Kobayashi et al. | H01L 27/14612 |
| 2016/0334550 A1 | 11/2016 | Kawabata | G02B 3/0056 |
| 2016/0334621 A1 | 11/2016 | Kawabata et al. | H01L 27/14627 |
| 2016/0337608 A1* | 11/2016 | Numata | H04N 5/3532 |
| 2016/0360126 A1 | 12/2016 | Soda et al. | H01L 27/14641 |
| 2017/0077164 A1 | 3/2017 | Kawabata | H01L 27/14645 |
| 2017/0078557 A1 | 3/2017 | Kawabata et al. | H04N 5/37457 |
| 2017/0078594 A1 | 3/2017 | Kawabata et al. | H04N 5/2353 |
| 2017/0078604 A1 | 3/2017 | Kobayashi et al. | H04N 5/3575 |
| 2017/0104942 A1 | 4/2017 | Hirota et al. | H04N 5/35563 |
| 2017/0339353 A1* | 11/2017 | Banachowicz | H04N 5/355 |
| 2017/0347042 A1* | 11/2017 | Borthakur | H04N 5/355 |

OTHER PUBLICATIONS

U.S. Appl. No. 15/589,830, filed May 8, 2017.
U.S. Appl. No. 15/631,411, filed Jun. 23, 2017.
U.S. Appl. No. 15/631,391, filed Jun. 23, 2017.
U.S. Appl. No. 15/584,718, filed May 2, 2017.
U.S. Appl. No. 15/594,259, filed May 12, 2017.

* cited by examiner

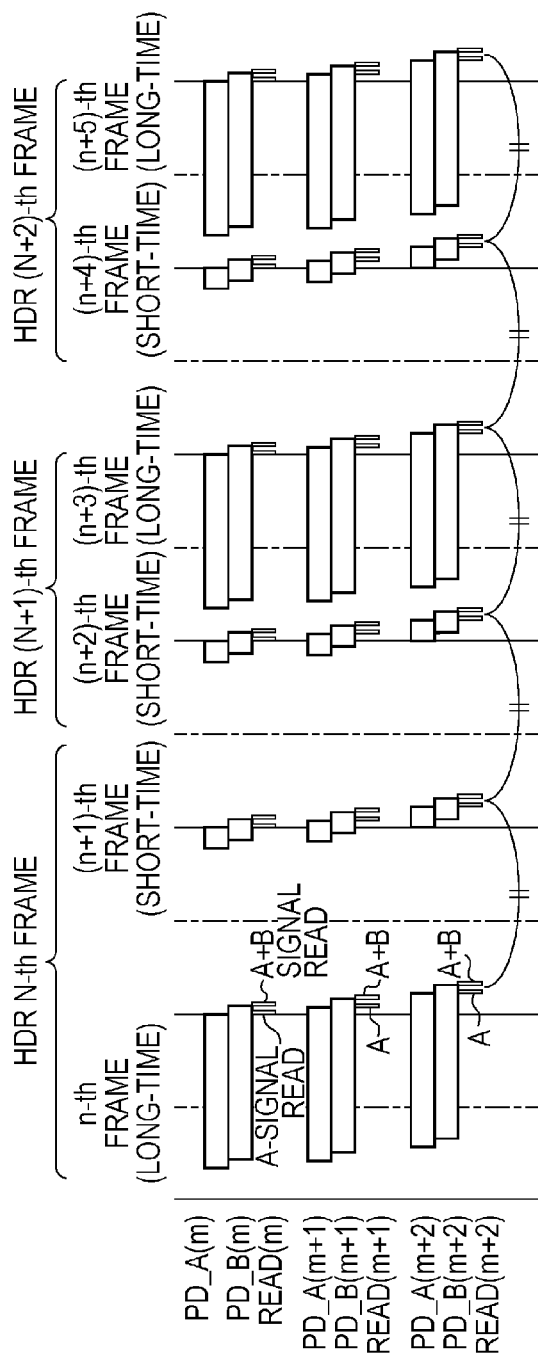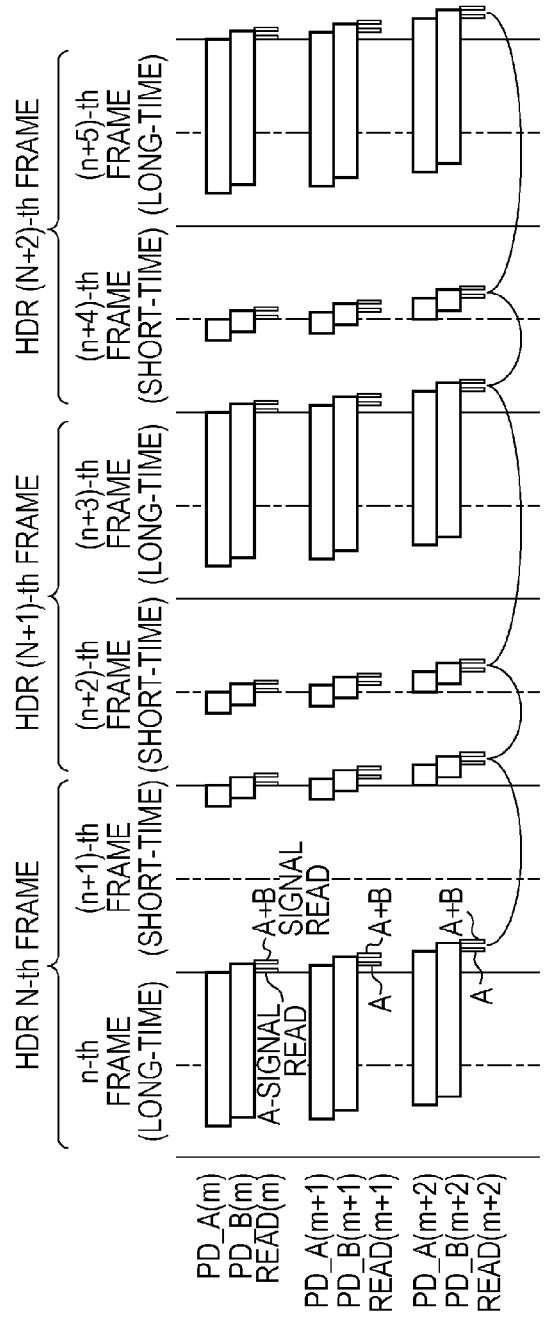
FIG. 5A
FIG. 5B

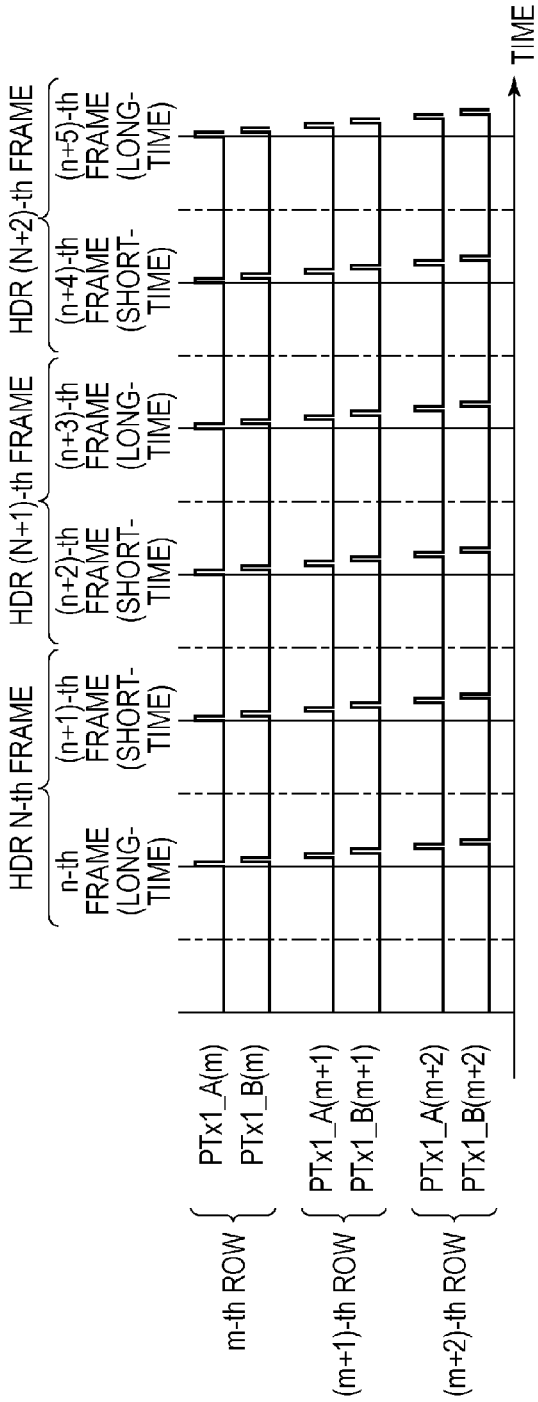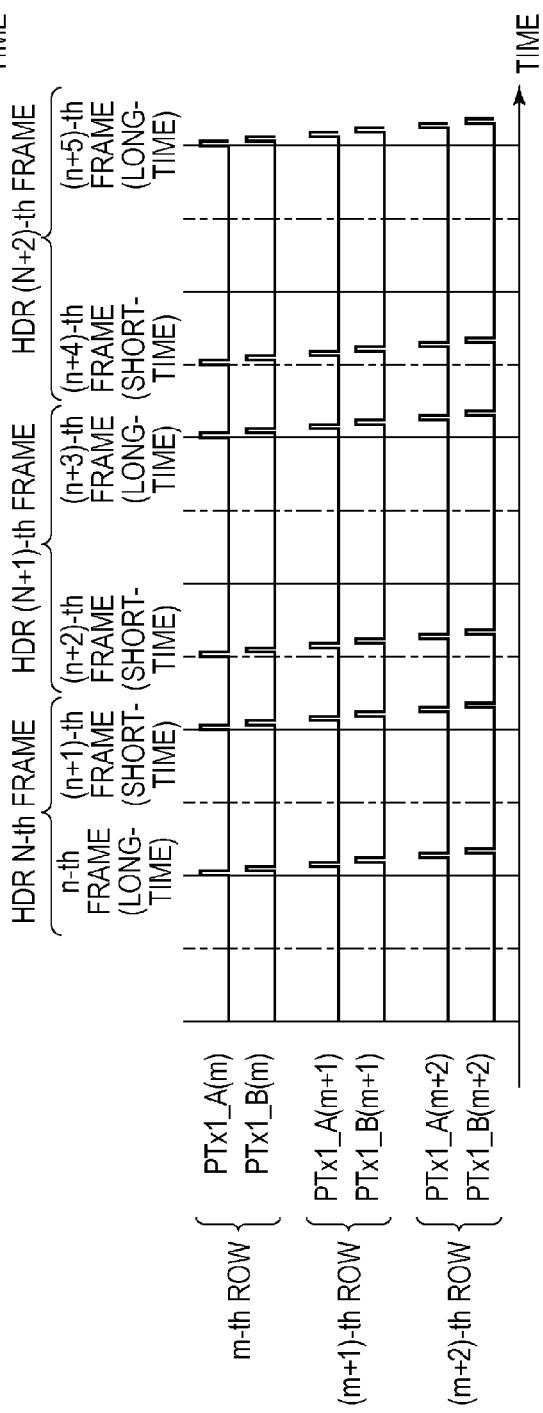

IMAGING DEVICE AND IMAGING SYSTEM

BACKGROUND OF THE INVENTION

Field of the Invention

The present invention relates to an imaging device and an imaging system.

Description of the Related Art

For an imaging device such as a CMOS image sensor, a technique has been proposed which generates an image signal of a high dynamic range by combining two image signals obtained under different imaging conditions. In a method disclosed in Japanese Patent Application Laid-Open No. 2015-201834, pixels having different sensitivities are provided, and pixel signals from these pixels are used to generate a high dynamic range image and to generate phase difference information.

The method disclosed in Japanese Patent Application Laid-Open No. 2015-201834 achieves generation of both a high dynamic range image and phase difference information, but does not necessarily achieve sufficient autofocus function.

SUMMARY OF THE INVENTION

An object of the present invention is to provide an imaging device and an imaging system capable of obtaining wide dynamic range moving images while performing high-performance autofocus.

According to one aspect of the present invention, there is provided an imaging device including a plurality of pixels each including a first photoelectric conversion unit on which a first part of pupil-divided incident light is incident, a second photoelectric conversion unit on which a second part of the pupil-divided incident light is incident, a first holding unit that holds charges transferred from the first photoelectric conversion unit and the second photoelectric conversion unit, and an amplifier unit that outputs a signal based on an amount of the charges held by the first holding unit, wherein each of the plurality of pixels is configured to output a first signal based on an amount of charges generated by the first photoelectric conversion unit during a first exposure time, a second signal based on an amount of charges generated by the first photoelectric conversion unit and the second photoelectric conversion unit during the first exposure time, a third signal based on an amount of charges generated by the first photoelectric conversion unit during a second exposure time, which is shorter than the first exposure time, and a fourth signal based on an amount of charges generated by the first photoelectric conversion unit and the second photoelectric conversion unit during the second exposure time, and in a certain one of frames, the first and second signals are output before the third and fourth signals, and in another one of the frames, the first and second signals are output after the third and fourth signals.

According to another aspect of the present invention, there is provided an imaging device including a plurality of pixels each including a first photoelectric conversion unit on which a first part of pupil-divided incident light is incident, a second photoelectric conversion unit on which a second part of the pupil-divided incident light is incident, a first holding unit and a second holding unit that hold charges transferred from the first photoelectric conversion unit, a third holding unit and a fourth holding unit that hold charges transferred from the second photoelectric conversion unit, a fifth holding unit that holds charges transferred from the first holding unit and the third holding unit, a sixth holding unit that holds charges transferred from the second holding unit and the fourth holding unit, a first amplifier unit that outputs a signal based on an amount of the charges held by the fifth holding unit, and a second amplifier unit that outputs a signal based on an amount of the charges held by the sixth holding unit, wherein the first holding unit is configured to hold charges generated by the first photoelectric conversion unit during a first exposure period, the second holding unit is configured to hold charges generated by the first photoelectric conversion unit during a second exposure period, which is shorter than the first exposure period, the third holding unit is configured to hold charges generated by the second photoelectric conversion unit during the first exposure period, and the fourth holding unit is configured to hold charges generated by the second photoelectric conversion unit during the second exposure period, and each of the plurality of pixels is configured to output a first signal based on an amount of the charges generated by the first photoelectric conversion unit during the first exposure period, a second signal based on an amount of the charges generated by the first photoelectric conversion unit and the second photoelectric conversion unit during the first exposure period, a third signal based on an amount of the charges generated by the first photoelectric conversion unit during the second exposure period, and a fourth signal based on an amount of the charges generated by the first photoelectric conversion unit and the second photoelectric conversion unit during the second exposure period.

According to further another aspect of the present invention, there is provided a method for driving an imaging device including a plurality of pixels each including a first photoelectric conversion unit on which a first part of pupil-divided incident light is incident, a second photoelectric conversion unit on which a second part of the pupil-divided incident light is incident, a first holding unit that holds charges transferred from the first photoelectric conversion unit and the second photoelectric conversion unit, and an amplifier unit that outputs a signal based on an amount of the charges held by the first holding unit, the method including outputting a first signal based on an amount of charges generated by the first photoelectric conversion unit during a first exposure time, outputting a second signal based on an amount of charges generated by the first photoelectric conversion unit and the second photoelectric conversion unit during the first exposure time, outputting a third signal based on an amount of charges generated by the first photoelectric conversion unit during a second exposure time, which is shorter than the first exposure time, and outputting a fourth signal based on an amount of charges generated by the first photoelectric conversion unit and the second photoelectric conversion unit during the second exposure time, wherein the first and second signals are output before the third and fourth signals in a certain one of frames, and output after the third and fourth signals in another one of the frames.

Further features of the present invention will become apparent from the following description of exemplary embodiments with reference to the attached drawings.

BRIEF DESCRIPTION OF THE DRAWINGS

FIGS. 5A and 5B are schematic diagrams illustrating a method for driving the imaging device according to the first embodiment of the present invention.

FIGS. 6A, 6B, 7A, and 7B are timing charts illustrating the method for driving the imaging device according to the first embodiment of the present invention.

DESCRIPTION OF THE EMBODIMENTS

Embodiments of the present invention will now be described in detail in accordance with the accompanying drawings. Embodiments according to the present invention are, of course, not limited to the embodiments described below. Embodiments of the present invention also include a mode in which part of the configuration of a certain embodiment is added to another embodiment or replaced by part of the configuration of another embodiment.

First Embodiment

An imaging device and a method for driving the same according to a first embodiment of the present invention will be described with reference to FIGS. 1 to 7B.

Figure 1:
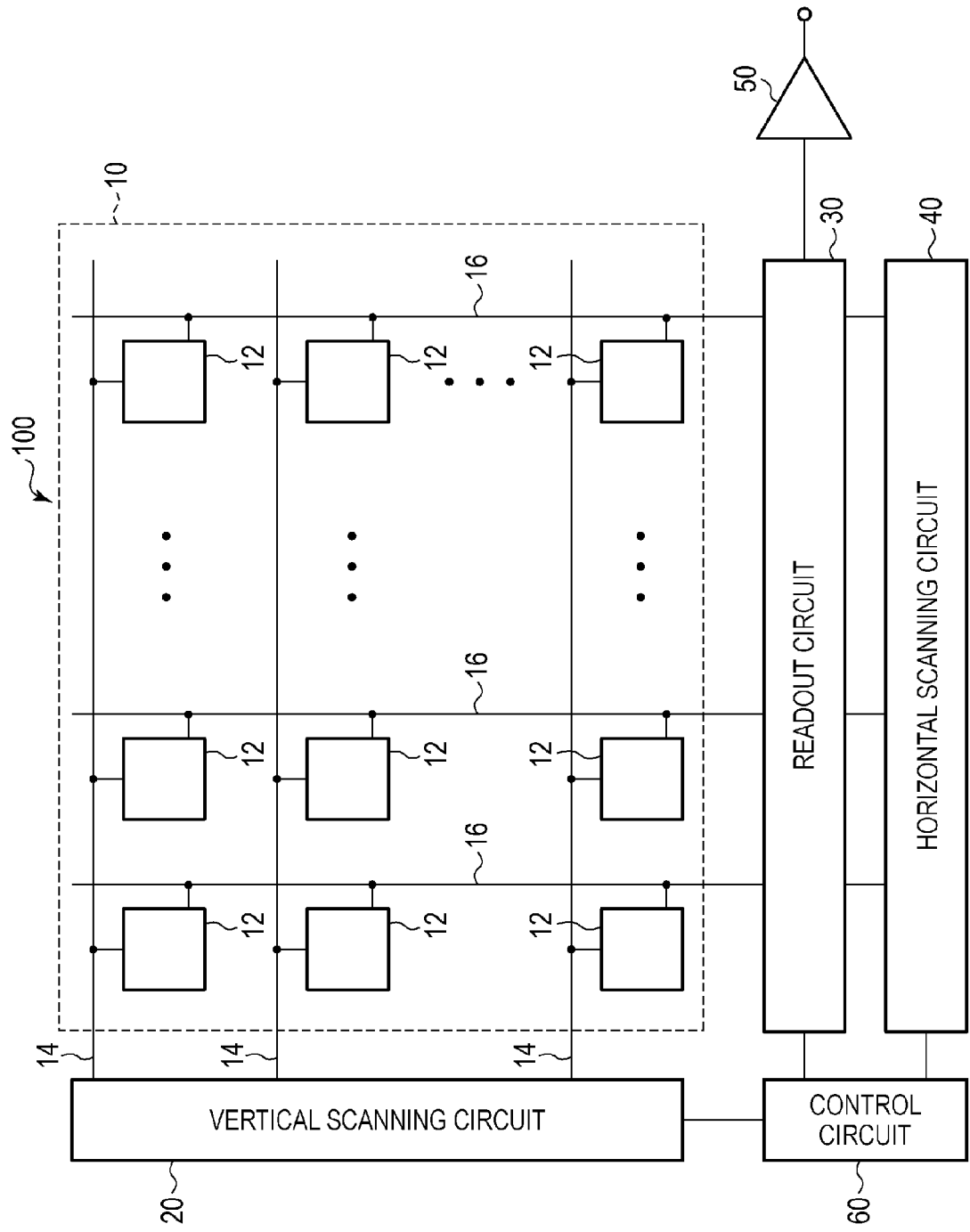
FIG. 1 is a block diagram illustrating the schematic configuration of an imaging device according to a first embodiment of the present invention.
Figure 2:
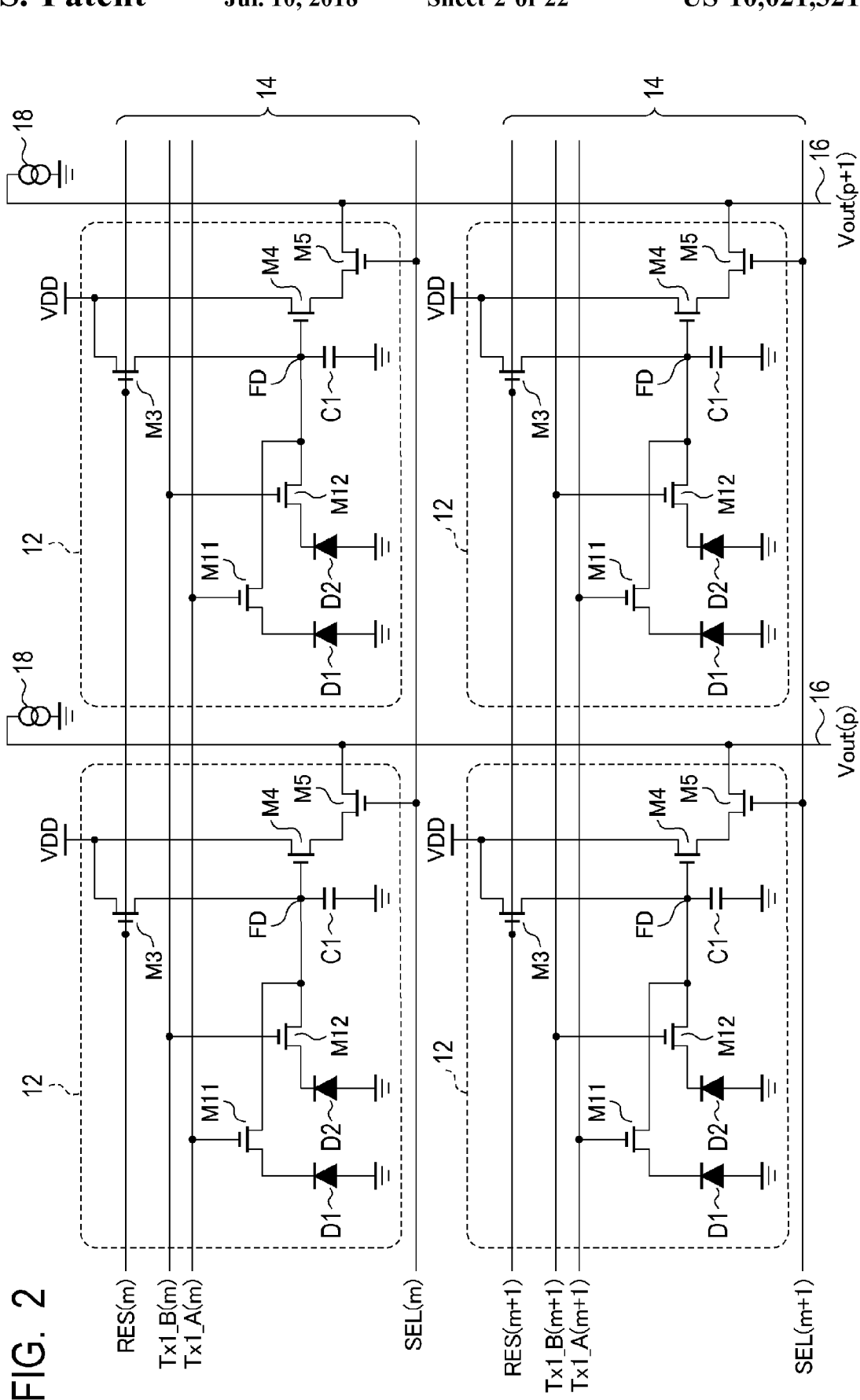
FIG. 2 is a diagram illustrating an example of configuration of a pixel circuit of the imaging device according to the first embodiment of the present invention.
Figure 3:
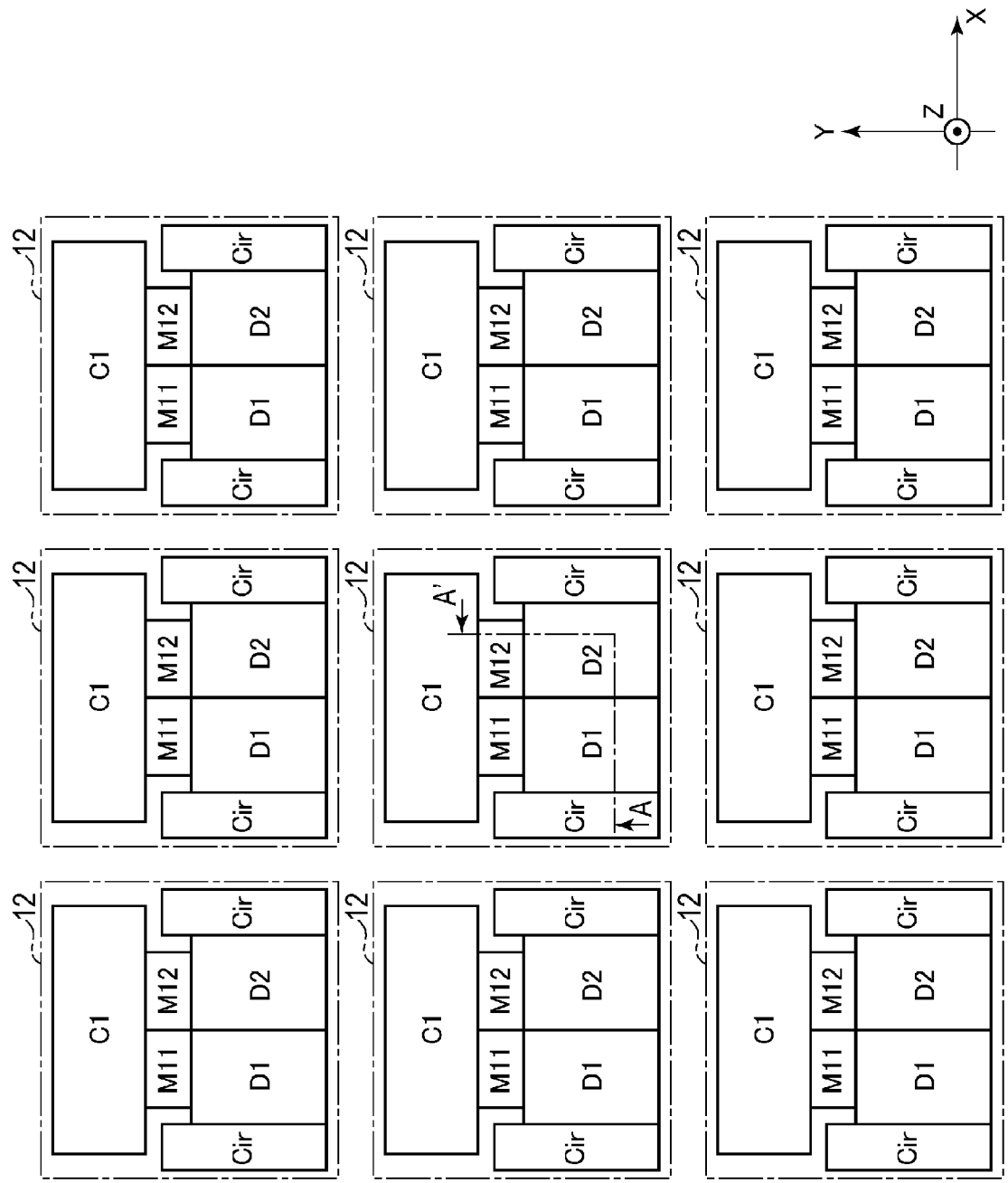
FIG. 3 is a schematic diagram illustrating an example of a plan-view layout of a pixel array unit of the imaging device according to the first embodiment of the present invention.
Figure 4:
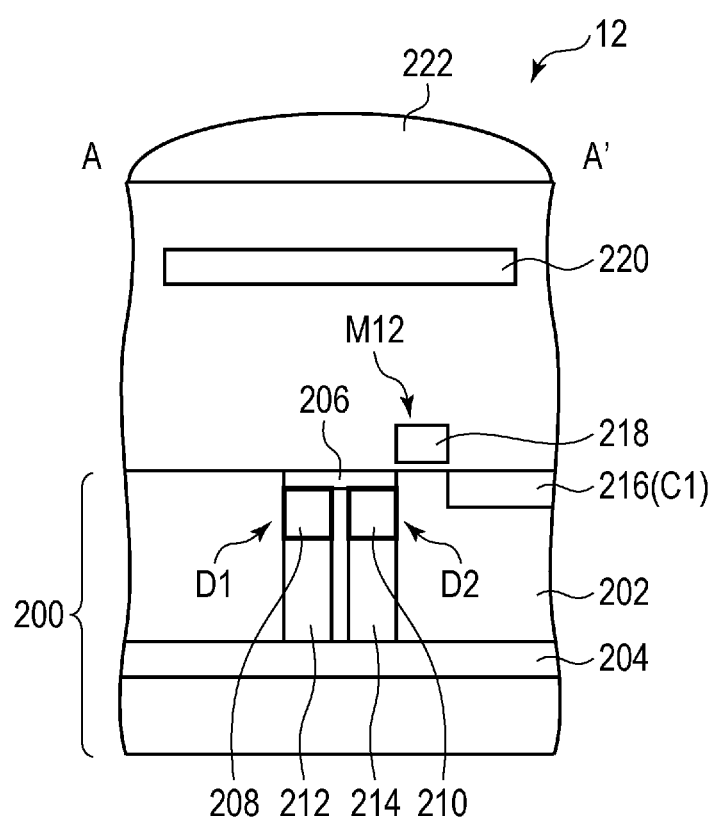
FIG. 4 is a cross-sectional view illustrating an example of a pixel structure in the imaging device according to the first embodiment of the present invention.

FIG. 1 is a block diagram illustrating the schematic configuration of the imaging device according to the present embodiment. FIG. 2 is a diagram illustrating an example of configuration of a pixel circuit of the imaging device according to the present embodiment. FIG. 3 is a schematic diagram illustrating an example of a plan-view layout of a pixel array unit of the imaging device according to the present embodiment. FIG. 4 is a cross-sectional view illustrating an example of a pixel structure in the imaging device according to the present embodiment. FIGS. 5A and 5B are schematic diagrams illustrating a method for driving the imaging device according to the present embodiment. FIGS. 6A to 7B are timing charts illustrating the method for driving the imaging device according to the present embodiment.

First, taking a CMOS image sensor as an example, a description is given of the configuration of the imaging device according to the present embodiment with reference to FIGS. 1 to 4.

An imaging device 100 according to the present embodiment has, as illustrated in FIG. 1, a pixel array unit 10, a vertical scanning circuit 20, a readout circuit 30, a horizontal scanning circuit 40, an output circuit 50, and a control circuit 60.

The pixel array unit 10 includes a plurality of pixels 12 arranged in columns and rows. Each of the pixels 12 includes photoelectric conversion elements that convert incident light into charges that correspond to the intensity of the light.

The vertical scanning circuit 20 is a circuit unit that supplies the pixels 12, via control signal lines 14 provided for each of the rows of the pixel array, with control signals for driving the readout circuit in the pixels 12 to read signals out from the pixels 12. Herein, the vertical scanning circuit 20 may be referred to as a control signal supply unit. The signals read out from the pixels 12 are input to the readout circuit 30 via an output line 16 provided for each of the columns of the pixel array.

The readout circuit 30 is a circuit unit that performs predetermined processing on signals read out from the pixels 12, the predetermined processing including signal processing such as amplification processing and addition processing. The readout circuit 30 may include a column amplifier, a correlated double sampling (CDS) circuit, and an adding circuit. The readout circuit 30 may further include, if necessary, an analog-digital conversion circuit.

The horizontal scanning circuit 40 is a circuit unit that supplies the readout circuit 30 with control signals so that the readout circuit 30 transfers processed signals to the output circuit 50 sequentially on a column-by-column basis. The output circuit 50 is a circuit unit that is configured with a buffer amplifier, a differential amplifier, or the like, and outputs signals from the column selected by the horizontal scanning circuit 40 after amplifying the signals.

The control circuit 60 is a circuit unit that supplies the vertical scanning circuit 20, the readout circuit 30, and the horizontal scanning circuit 40 with control signals to control their operations and timings. Some or all of the control signals supplied to the vertical scanning circuit 20, the readout circuit 30, and the horizontal scanning circuit 40 may be given from the outside of the imaging device 100.

FIG. 2 is a circuit diagram illustrating an example of a pixel circuit forming the pixel array unit 10. Although FIG. 2 illustrates only four pixels 12 arranged in two rows and two columns out of the pixels 12 constituting the pixel array unit 10, the pixel array unit 10 typically includes many more pixels 12.

Each of the pixels 12 includes photoelectric conversion units D1, D2, transfer transistors M11, M12, a reset transistor M3, an amplifier transistor M4, and a select transistor M5. The photoelectric conversion units D1, D2 are, for example, photodiodes. The photodiode as the photoelectric conversion unit D1 has its anode connected to a grounded voltage line and its cathode connected to the source of the transfer transistor M11. The photodiode as the photoelectric conversion unit D2 has its anode connected to a grounded voltage line and its cathode connected to the source of the transfer transistor M12. The drains of the transfer transistors M11, M12 are connected to the source of the reset transistor M3 and the gate of the amplifier transistor M4. The node where the drains of the transfer transistors M11, M12, the source of the reset transistor M3, and the gate of the amplifier transistor M4 connect is what is called a floating diffusion (FD) region. A capacitance component parasitically coupled to the FD region (floating diffusion capacitor) has a function as a charge holding unit. In FIG. 2, this capacitance component is denoted by a capacitor (C1) connected to the FD region. In the following description, the FD region is also referred to as a holding unit C1. The drain of the reset transistor M3 and the drain of the amplifier transistor M4 are connected to a power voltage supply line (VDD). The source of the amplifier transistor M4 is connected to the drain of the select transistor M5. The source of the select transistor M5 is connected to the output line 16.

The control signal lines 14 are arranged for each of the rows of the pixel array of the pixel array unit 10, extending in the direction of the rows (the lateral direction in the orientation illustrated in FIG. 2). Each of the control signal lines 14 includes a control line Tx1_A, a control line Tx1_B, a control line RES, and a control line SEL. The control line Tx1_A is connected to the gates of the transfer transistors M11 of the pixels 12 arranged in the row direction, forming a common signal line to these pixels 12. The control line Tx1_B is connected to the gates of the transfer transistors M12 of the pixels 12 arranged in the row direction, forming a common signal line to these pixels 12. The control line RES is connected to the gates of the reset transistors M3 of the pixels 12 arranged in the row direction, forming a common signal line to these pixels 12. The control line SEL is connected to the gates of the select transistor M5 of the pixels 12 arranged in the row direction, forming a common signal line to these pixels 12. In FIG. 2, the names of the control lines each have the number of the corresponding row attached at the end (e.g., Tx1_A(m), Tx1_A(m+1), and so on).

The control line Tx1_A, the control line Tx1_B, the control line RES, and the control line SEL are connected to the vertical scanning circuit 20. The vertical scanning circuit 20 outputs to the control line Tx1_A a control signal PTx1_A as a drive pulse for controlling the transfer transistors M11. The vertical scanning circuit 20 outputs to the control line Tx1_B a control signal PTx1_B as a drive pulse for controlling the transfer transistors M12. The vertical scanning circuit 20 outputs to the control line RES a control signal PRES as a drive pulse for controlling the reset transistors M3. The vertical scanning circuit 20 outputs to the control line SEL a control signal SEL as a drive pulse for controlling the select transistors M5. In a typical example, the transistors are turned on when the vertical scanning circuit 20 outputs a high-level control signal to the transistors, and are turned off when the vertical scanning circuit 20 outputs a low-level control signal to the transistors. These control signals are supplied by the vertical scanning circuit 20 in response to predetermined timing signals from the control circuit 60. A logic circuit such as a shift register or an address decoder may be used as the vertical scanning circuit 20.

The output lines 16 are arranged for each of the columns of the pixel array of the pixel array unit 10, extending in the direction of the columns (the vertical direction in the orientation illustrated in FIG. 2). The output line 16 is connected to the sources of the select transistors M5 of the pixels 12 arranged in the column direction, forming a common signal line to these pixels 12. The select transistors M5 may be omitted from the pixels 12. When the pixels 12 are without the select transistors M5, the output line 16 is connected to the sources of the amplifier transistors M4. Each of the output lines 16 is connected to a current source 18.

The photoelectric conversion units D1, D2 converts incident light into charges that correspond to the intensity of the light (performs photoelectric conversion), and also accumulates the charges thus generated. The transfer transistor M11 transfers the charges held by the photoelectric conversion unit D1 to the holding unit C1. The transfer transistor M12 transfers the charges held by the photoelectric conversion unit D2 to the holding unit C1. The holding unit C1 holds the charges generated by the photoelectric conversion units D1, D2, at a location different from the photoelectric conversion units D1, D2. The holding unit C1 not only holds the charges transferred from the photoelectric conversion units D1, D2, but also sets a voltage for the input node of an amplifier unit (the gate of the amplifier transistor M4) according to the capacitance thereof and the amount of the charges transferred. The reset transistor M3 resets the potentials of the holding unit C1 and the photoelectric conversion units D1, D2. The select transistor M5 selects whether to output a signal to the output line 16 from the pixel 12. The amplifier transistor M4 is so configured that its drain is supplied with the power supply voltage and its source is supplied with a bias current from the current source 18 via the select transistor M5, and forms an amplifier unit with its gate serving as an input node (a source follower circuit). The amplifier transistor M4 thus configured outputs to the output line 16 a signal Vout, which is based on the charges generated depending on incident light. In FIG. 2, the signals Vout each have the number of the corresponding column attached at the end (e.g., Vout(p) and Vout(p+1)).

FIG. 3 is a schematic diagram illustrating an example of a plan-view layout of the pixel array unit 10. FIG. 3 illustrates blocks of the circuit elements forming a pixel circuit to represent their locations within a unit pixel area. In the following illustration of the positional relations among the circuit elements, the coordinate system illustrated in FIG. 3 may be used. The X-Y plane is parallel to a surface of a semiconductor substrate on which the imaging device is formed (the imaging plane), and the Z direction is normal to the semiconductor substrate. In one example, the X direction is horizontal and corresponds to the row direction, and the Y direction is vertical and corresponds to the column direction. FIG. 4 is a schematic cross-sectional view taken along the line A-A' in FIG. 3.

In FIG. 3, the block denoted by reference sign D1 represents the location of the photoelectric conversion unit D1. The block denoted by reference sign D2 represents the location of the photoelectric conversion unit D2. The block denoted by reference sign M11 represents the location of the transfer transistor M11. The block denoted by reference sign M12 represents the location of the transfer transistor M12. The block denoted by reference sign C1 represents the location of the holding unit C1, which is the FD region. The blocks denoted by reference sign Cir represent the locations of the rest of the circuit elements, namely, the reset transistor M3, the amplifier transistor M4, and the select transistor M5.

The photoelectric conversion unit D1 and the photoelectric conversion unit D2 are arranged adjacently to align in the X direction. The photoelectric conversion unit D1, the transfer transistor M11, and the holding unit C1 are arranged adjacently to align in the Y direction in the order mentioned. The photoelectric conversion unit D2, the transfer transistor M12, and the holding unit C1 are arranged adjacently to align in the Y direction in the order mentioned. The other circuit elements Cir are arranged on the outer sides of the photoelectric conversion units D1, D2.

Having such a layout, the pixel 12 can be used as focus detection pixel for phase detection autofocus in which the phase difference in the X direction is detected. All or some of the pixels 12 in the imaging device 100 may be used as the focus detection pixels. If some of the pixels 12 are used as the focus detection pixels, the focus detection pixels may be arranged in a part of the pixel array unit 10, or may be scattered over the pixel array unit 10. In the example illustrated in FIG. 3, the photoelectric conversion units D1, D2 are arranged adjacently to align in the X direction to be able to detect the phase difference in the X direction. Alternatively, the photoelectric conversion units D1, D2 may be arranged adjacently to align in the Y direction to be able to detect the phase difference in the Y direction. In other configurations, three or more photoelectric conversion units may be arranged within one pixel 12 to improve the accuracy of phase detection, or the photoelectric conversion units of one pixel 12 may be sized differently depending on where the pixel 12 is located within the pixel array unit 10.

As illustrated in FIG. 4, the imaging device 100 includes a semiconductor substrate 200. The semiconductor substrate 200 is, for example, an n-type silicon substrate. The semiconductor substrate 200 has on its main surface side a p-type semiconductor region 202 as a well. The semiconductor substrate 200 has a p-type semiconductor region 204 which is located deeper than the p-type semiconductor region 202 and has a higher impurity concentration than the p-type semiconductor region 202.

The photoelectric conversion unit D1 includes a p-type semiconductor region 206 provided in a surface portion of the p-type semiconductor region 202 and an n-type semiconductor region 208 provided in contact with a lower portion of the p-type semiconductor region 206. The p-type semiconductor region 206 and the n-type semiconductor region 208 form a p-n junction. The photoelectric conversion unit D1 is what is called a buried photodiode. An n-type semiconductor region 212 is provided in contact with a lower portion of the n-type semiconductor region 208, the n-type semiconductor region 212 having a lower impurity concentration than the n-type semiconductor region 208. This arrangement allows the n-type semiconductor region 208 to collect charges generated in deep locations. A p-type semiconductor region may be provided instead of the n-type semiconductor region 212.

Similarly, the photoelectric conversion unit D2 includes the p-type semiconductor region 206 and an n-type semiconductor region 210 provided in contact with a lower portion of the p-type semiconductor region 206. The n-type semiconductor region 210 is spaced apart from the n-type semiconductor region 208. The p-type semiconductor region 206 and the n-type semiconductor region 210 form a p-n junction. An n-type semiconductor region 214 is provided in contact with a lower portion of the n-type semiconductor region 210, the n-type semiconductor region 214 having a lower impurity concentration than the n-type semiconductor region 210. This arrangement allows the n-type semiconductor region 210 to collect charges generated in deep locations. A p-type semiconductor region may be provided instead of the n-type semiconductor region 214.

The p-type semiconductor region 204 under the n-type semiconductor regions 212, 214 forms a potential barrier against charges (electrons) generated and accumulated by the photoelectric conversion units D1, D2.

The transfer transistor M12 includes the n-type semiconductor region 210 as a source region and an n-type semiconductor region 216 as a drain region. The n-type semiconductor region 216 also acts as a floating diffusion capacitor, namely, the holding unit C1. A gate electrode 218 of the transfer transistor M12 is provided over the semiconductor substrate 200 with a gate insulating film interposed therebetween, in an area between the n-type semiconductor region 210 and the n-type semiconductor region 216.

Elements such as a color filter 220 and a microlens 222 are disposed above the photoelectric conversion units D1, D2. The microlens 222 is provided for each pixel 12 and shared by its plural (two here) photoelectric conversion units D1, D2. To be more specific, light passing through the microlens 222 is pupil-divided, with part of the light entering the photoelectric conversion unit D1 and the other part entering the photoelectric conversion unit D2.

In the pixel 12 of the present embodiment, the photoelectric conversion unit is divided into the photoelectric conversion unit D1 and the photoelectric conversion unit D2, with an isolation region provided between these two photoelectric conversion units D1, D2. Then, if the photoelectric conversion unit D1 and the photoelectric conversion unit D2 are arranged adjacently to align in the X direction, the pixel 12 can be used as a focus detection pixel for the phase detection autofocus that detects the phase difference in the X direction. Although the isolation region is formed by the p-type semiconductor region 202 in the above example, the isolation region does not necessarily have to be formed by a semiconductor region with an even impurity concentration. For example, part of the isolation region may be formed by a p-type semiconductor region having a lower impurity concentration than the p-type semiconductor region 202 or may be formed by an n-type semiconductor region. Although FIG. 4 illustrates an example of an imaging device of a frontside illuminated type, the present invention may be applied to an imaging device of a backside illuminated type.

Next, a method for driving the imaging device according to the present embodiment will be described with reference to FIGS. 5A to 7B. Although imaging operation performed for capturing moving images is described as an example below, the imaging operation may be used similarly for capturing still images.

The imaging device of the present embodiment acquires two kinds of signals with different exposure times to generate a high dynamic range image (high dynamic range (HDR) imaging). When two kinds of signals obtained with different exposure times are used to combine images, the object can be captured with high quality from its dark part to bright part. In addition, to achieve image plane phase detection autofocus, the imaging device of the present embodiment obtains a plurality of parallax images by reading out signals from the photoelectric conversion units included in one pixel 12 at different timings.

FIGS. 5A and 5B are schematic diagrams illustrating how the operation state of the imaging device transitions with time.

FIGS. 5A and 5B illustrate operation states in six frames: an n-th frame to an (n+5)-th frame. In this example, HDR imaging is performed using signals obtained in successive two frames. Specifically, FIGS. 5A and 5B illustrate the operation states in three HDR frames for acquiring HDR images: an N-th frame (the "HDR N-th frame" in FIGS. 5A and 5B) to an (N+2)-th frame (the "HDR (N+2)-th frame" in FIGS. 5A and 5B). Herein, a signal from the n-th frame and a signal from the (n+1)-th frame are combined to generate an image for the HDR N-th frame, a signal from the (n+2)-th frame and a signal from the (n+3)-th frame are combined to generate an image for the HDR (N+1)-th frame, and a signal from the (n+4)-th frame and a signal from the (n+5)-th frame are combined to generate an image for the HDR (N+2)-th frame.

Terms used in FIGS. 5A and 5B have meanings as follows. "PD_A" represents an exposure period of the photoelectric conversion unit D1, "PD_B" represents an exposure period of the photoelectric conversion unit D2, and "READ" represents a signal readout period. The signs (m), (m+1), and (m+2) added to the reference signs for these periods represent the row numbers. "A-SIGNAL READ" and "A" represent a period when a signal based on signal charges generated by the photoelectric conversion unit D1 (an A-signal) is read. "A+B SIGNAL READ" and "A+B" represent a period when a signal based on total signal charges generated by the photoelectric conversion unit D1 and the photoelectric conversion unit D2 (an A+B signal) is read.

Each HDR frame includes a frame for outputting a signal based on charges accumulated during a relatively long exposure time (referred to as "LONG-TIME" in FIGS. 5A and 5B) and a frame for outputting a signal based on charges accumulated during a relatively short exposure time (referred to as "SHORT-TIME" in FIGS. 5A and 5B). For example, in the HDR N-th frame in FIGS. 5A and 5B, the n-th frame is the former case, and the (n+1)-th frame is the latter case.

FIGS. 6A and 6B are timing charts illustrating the operations of the transfer transistors M11, M12. The operations of the transfer transistors M11, M12 in FIGS. 6A and 6B correspond to the schematic diagrams in FIGS. 5A and 5B. In FIGS. 6A and 6B, the control signal PTx1_A is a control signal supplied to the gate of the transfer transistor M11, and the control signal PTx1_B is a control signal supplied to the gate of the transfer transistor M12. The signs (m), (m+1), and (m+2) added to the reference signs of these control signals represent the row numbers. These control signals turn the corresponding transfer transistors on when at a high level, and turn the corresponding transfer transistors off when at a low level.

Figure 7A:
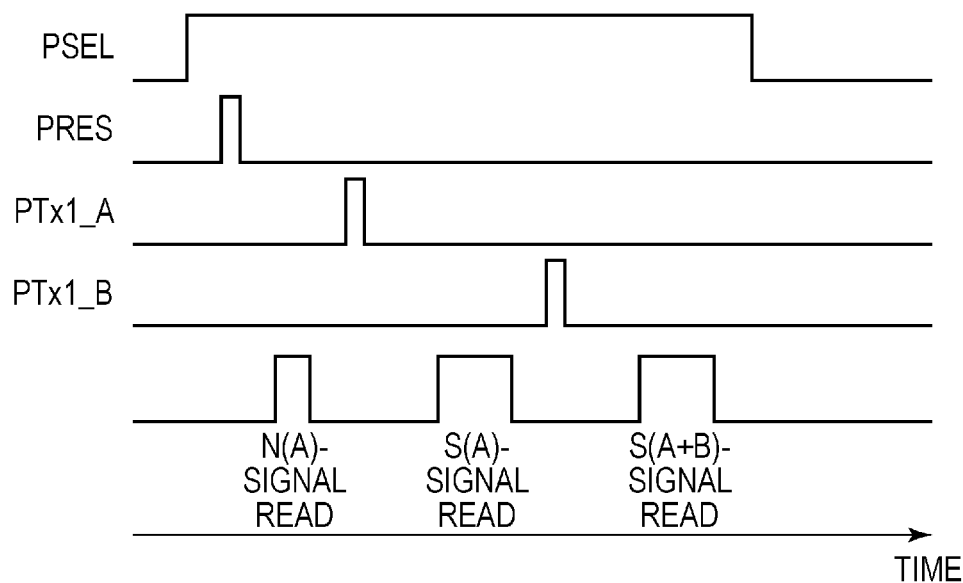
Figure 7B:
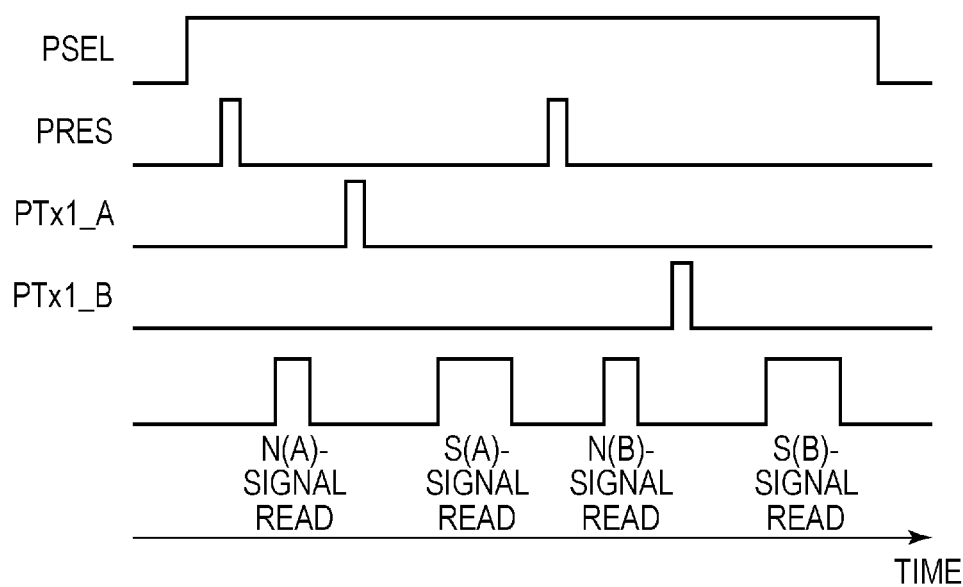

FIGS. 7A and 7B are timing charts illustrating a signal readout operation in one horizontal period. FIGS. 7A and 7B illustrate a control signal PSEL supplied to the select transistor M5, the control signal PRES supplied to the reset transistor M3, the control signal PTx1_A supplied to the transfer transistor M11, and the control signal PTx1_B supplied to the transfer transistor M12. These control signals turn the corresponding transistors on when at a high level, and turn the corresponding transistors off when at a low level.

FIGS. 5A and 6A indicate a case where the signal readout operation is performed at constant intervals.

In the n-th frame, charges are accumulated during, for example, a relatively long exposure time (hereinafter called a "long exposure period") out of the two exposure times. After charges are accumulated in the photoelectric conversion unit D1 and the photoelectric conversion unit D2 of each of the pixels 12 in the m-th row for the predetermined exposure time, signals based on the charges accumulated in the photoelectric conversion units D1, D2 are read out from each of the pixels 12 in the m-th row. For the (m+1)-th row, the (m+2)-th row, etc., charges are accumulated during the predetermined exposure time and signals are read out in the same manner. The signal readout operation can be performed for each row according to, for example, the timing charts illustrated in FIGS. 7A and 7B.

The operation in FIG. 7A sequentially performs selection of the pixel 12, reset, readout of a noise signal ("N(A)-SIGNAL READ"), transfer of charges from the photoelectric conversion unit D1, readout of a light signal ("S(A)-SIGNAL READ"), transfer of charges from the photoelectric conversion unit D2, and readout of a light signal ("S(A+B)-SIGNAL READ"). The "S(A)-SIGNAL READ" is to read out a signal based on the charges generated by the photoelectric conversion unit D1 (an A-signal). The "S(A+B)-SIGNAL READ" is to read out a signal based on the total charges generated by the photoelectric conversion unit D1 and the photoelectric conversion unit D2. This way, the readout of the A-signal and the readout of the A+B-signal are performed sequentially at different timings. The B-signal can be calculated by subtraction of the A-signal from the A+B-signal.

The operation in FIG. 7B sequentially performs selection of the pixel 12, reset, readout of a noise signal ("N(A)-SIGNAL READ"), transfer of charges from the photoelectric conversion unit D1, and readout of a light signal ("S(A)-SIGNAL READ"). The operation in FIG. 7B then sequentially performs reset, readout of a noise signal ("N(B)-SIGNAL READ"), transfer of charges from the photoelectric conversion unit D2, and readout of a light signal ("S(B)-SIGNAL READ"). The "S(B)-SIGNAL READ" is to read out a signal based on charges generated by the photoelectric conversion unit D2 (a B-signal). This way, the readout of the A-signal and the readout of the B-signal are performed sequentially at different timings. The A+B-signal can be calculated by addition of the A-signal and the B-signal together.

Two parallax images can thus be obtained to be used for phase detection autofocus. In addition, an image based on charges accumulated during a long exposure period (hereinafter called a "long exposure image") can be obtained.

Next, in the (n+1) frame, charges are accumulated during a shorter exposure time than in the n-th frame (this exposure period is hereinafter called a "short exposure period"). Next, in similar procedures to that for the n-th frame, signals are read out sequentially from the pixels 12. Specifically, as illustrated in FIGS. 7A and 7B, in the readout of signals based on charges accumulated during the short exposure period, an A-signal and an A+B-signal or an A-signal and a B-signal are read out sequentially at different timings. Thus, two parallax images can be obtained to be used for phase detection autofocus. In addition, an image based on charges accumulated during the short exposure period (hereinafter called a "short exposure image") can be obtained.

Combining the long exposure image and the short exposure image thus obtained produces a wide dynamic range image for the HDR N-th frame. Further, each of the pairs of the parallax images (an image based on A-signal and an image based on B-signal) obtained in the process of acquiring the long exposure image and in the process of acquiring the short exposure image can be used to perform phase detection autofocus at the same time.

In the method for driving the imaging device according to the present embodiment, the order of the long-exposure-period frame and the short-exposure-period frame constituting an HDR frame may be changed appropriately. Specifically, a signal based on charges accumulated during the long exposure period may be acquired first in one frame, and a signal based on charges accumulated during the short exposure period may be acquired first in another frame. For instance, after the HDR N-th frame, the (n+2)-th frame and the (n+3)-th frame in the HDR (N+1)-th frame may be the short-exposure-period frame and the long-exposure-period frame, respectively.

The order of the short-exposure-period frame and the long-exposure-period frame in one HDR frame may be determined based on the signals in the previous frame. For instance, assume that it is determined that finer autofocus can be achieved with a signal based on the short exposure period acquired in the (n+1)-th frame than a signal based on the long exposure period acquired in the n-th frame. In such a case, the order of the long-exposure-period frame and the short-exposure-period frame are reversed in and after the (n+2)-th frame. Specifically, a signal based on charges accumulated during the short exposure period is read out in the (n+2)-th frame, and a signal based on charges accumulated during the long exposure period is read out in the (n+3)-th frame.

This way, parallax images obtained by signals based on charges accumulated during the short exposure period can be acquired earlier than parallax images obtained by signals based on charges accumulated during the long exposure period. This enables a correlation computation for autofocus to be carried out quickly using the parallax images obtained based on the exposure period appropriate for the conditions of the object, and therefore enables speedy focus adjustment.

In the driving example illustrated in FIGS. 5A and 6A, the (n+4)-th frame is the short-exposure-period frame and the (n+5)-th frame is the long-exposure-period frame. These frames, however, can also be appropriately reversed in order according to the conditions of the object. For instance, the (n+4)-th frame may be the long-exposure-period frame and the (n+5)-th frame may be the short-exposure-period frame.

The signal readout operation is performed at constant intervals in the driving example illustrated in FIGS. 5A and 6A, but does not necessarily have to be performed at constant intervals.

For example, as in the driving example illustrated in FIGS. 5B and 6B, the short exposure period in the (n+2)-th frame and the (n+4)-th frame may be advanced. In this way, the interval between acquisition of a signal based on the short exposure period and acquisition of a signal based on the long exposure period may be made longer than a half period of one frame. Such a configuration allows parallax images obtained by signals based on charges accumulated during the short exposure period to be obtained even earlier, enabling speedier focus adjustment.

As described thus far, according to the present embodiment, an imaging device with an image plane phase detection autofocus function can obtain wide dynamic range moving images while achieving high-performance autofocus.

Second Embodiment

An imaging device and a method for driving the same according to a second embodiment of the present invention will be described with reference to FIGS. 8 to 12. Components that are the same as those in the imaging device according to the first embodiment illustrated in FIGS. 1 to 7B are denoted by the same reference signs as those used in the first embodiment, and are either not described or described only briefly.

Figure 8:
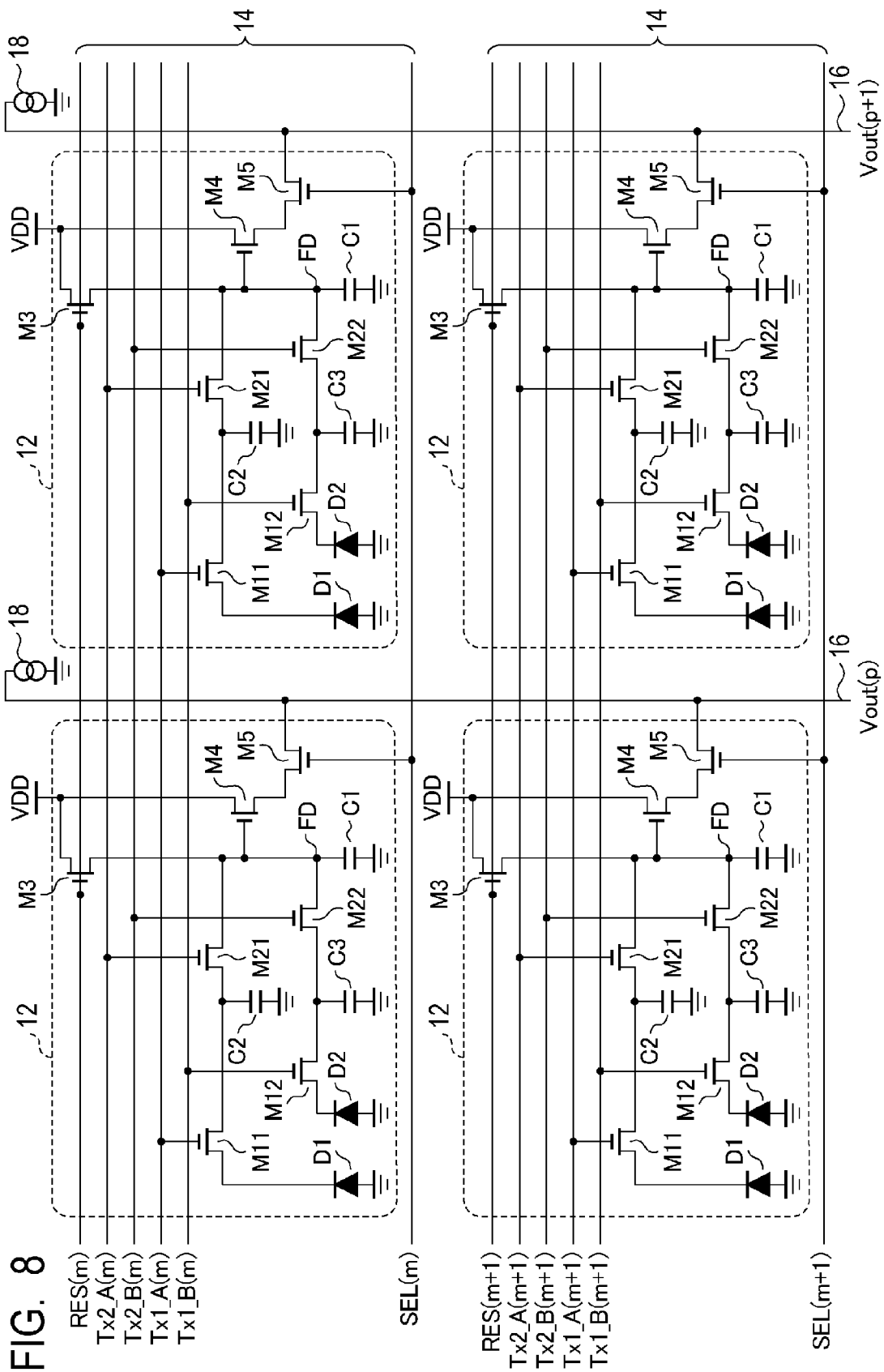
FIG. 8 is a diagram illustrating an example of configuration of a pixel circuit of an imaging device according to a second embodiment of the present invention.
Figure 9:
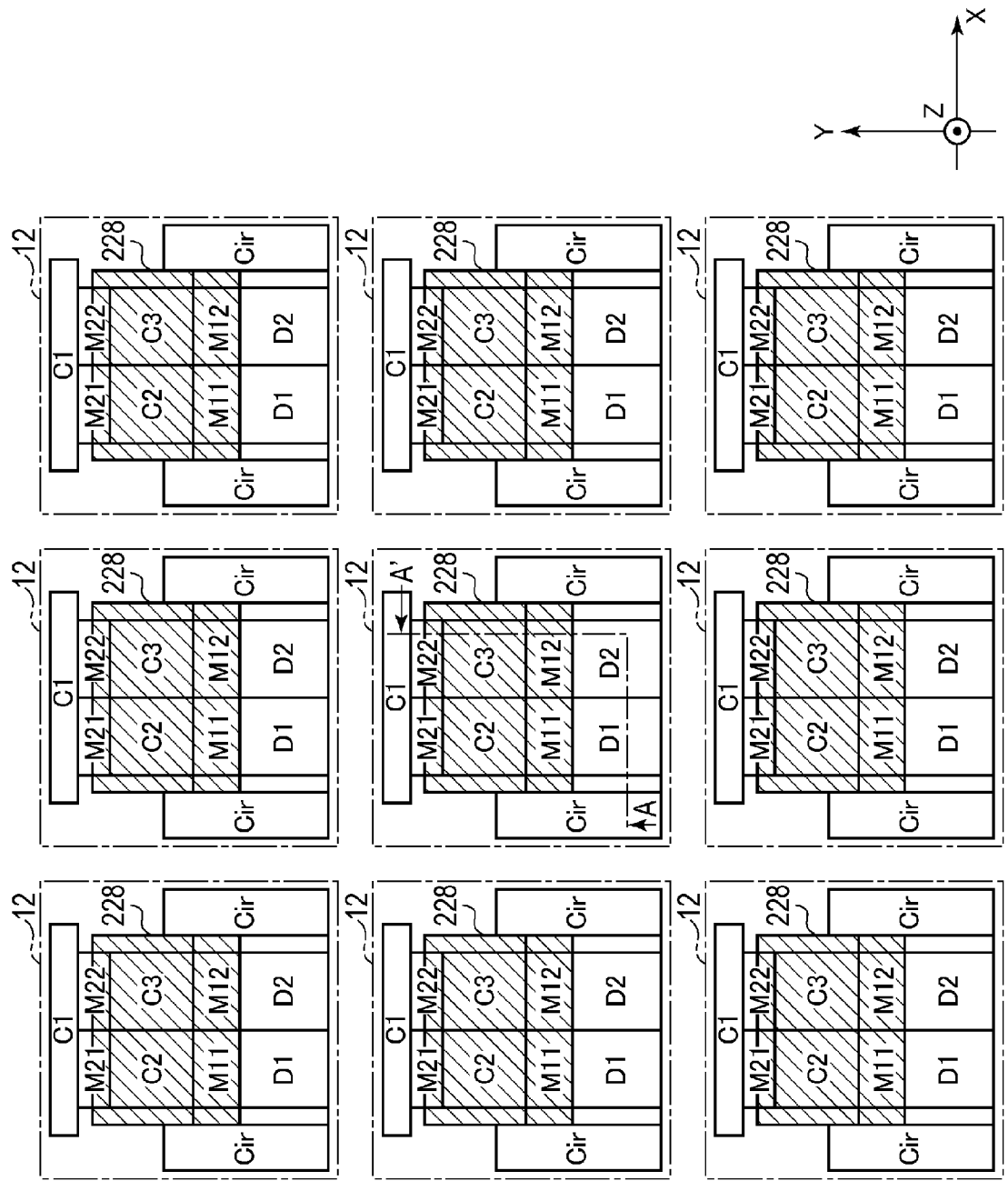
FIG. 9 is a schematic diagram illustrating an example of a plan-view layout of a pixel array unit of the imaging device according to the second embodiment of the present invention.
Figure 10:
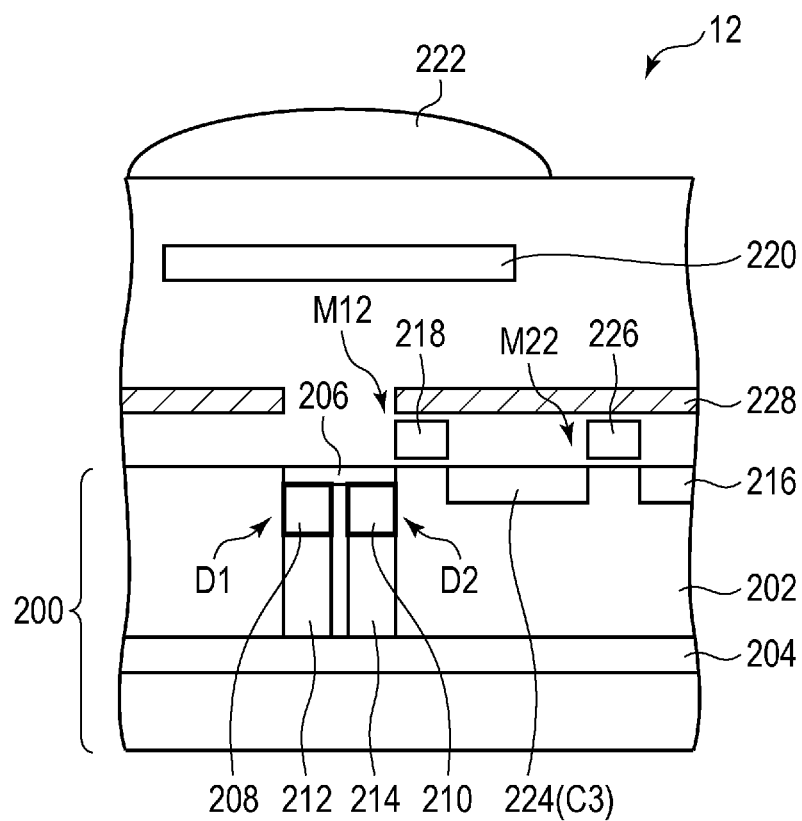
FIG. 10 is a cross-sectional view illustrating an example of a pixel structure in the imaging device according to the second embodiment of the present invention.
Figure 11:
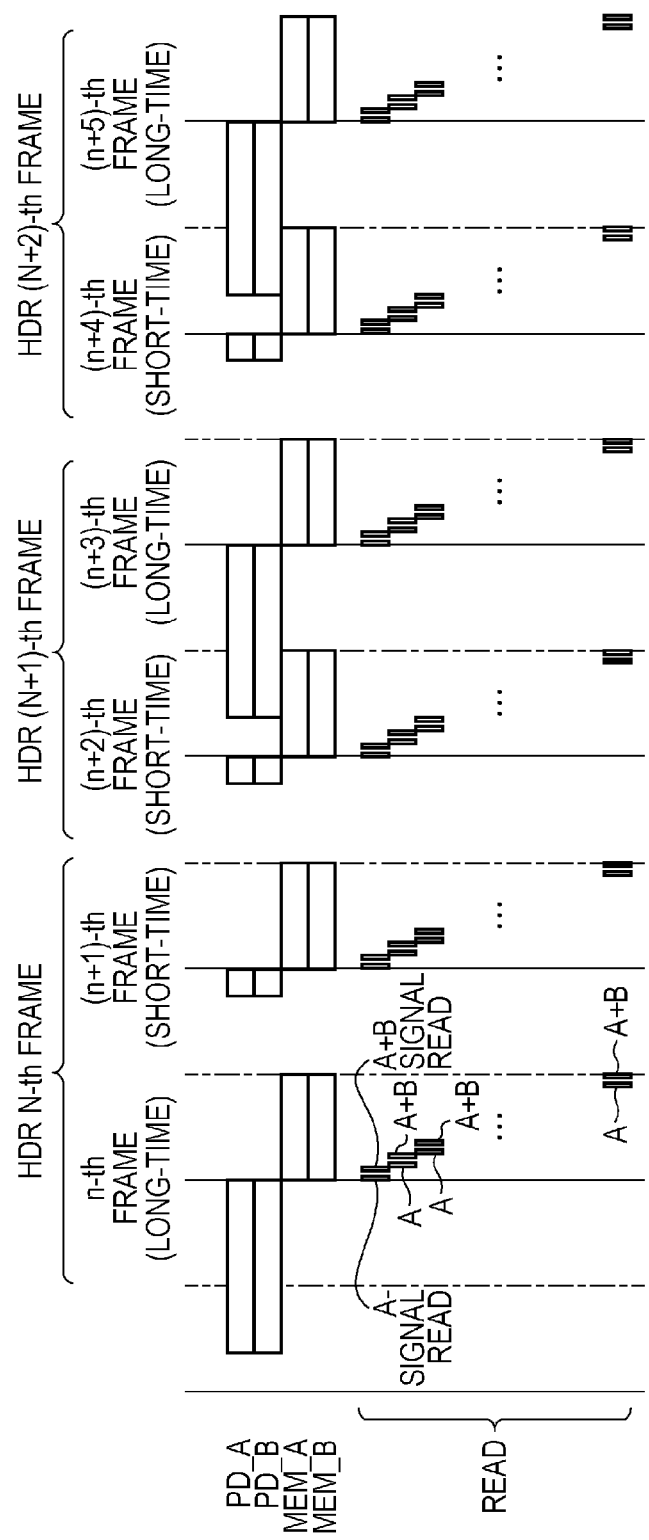
FIG. 11 is a schematic diagram illustrating a method for driving the imaging device according to the second embodiment of the present invention.
Figure 12:
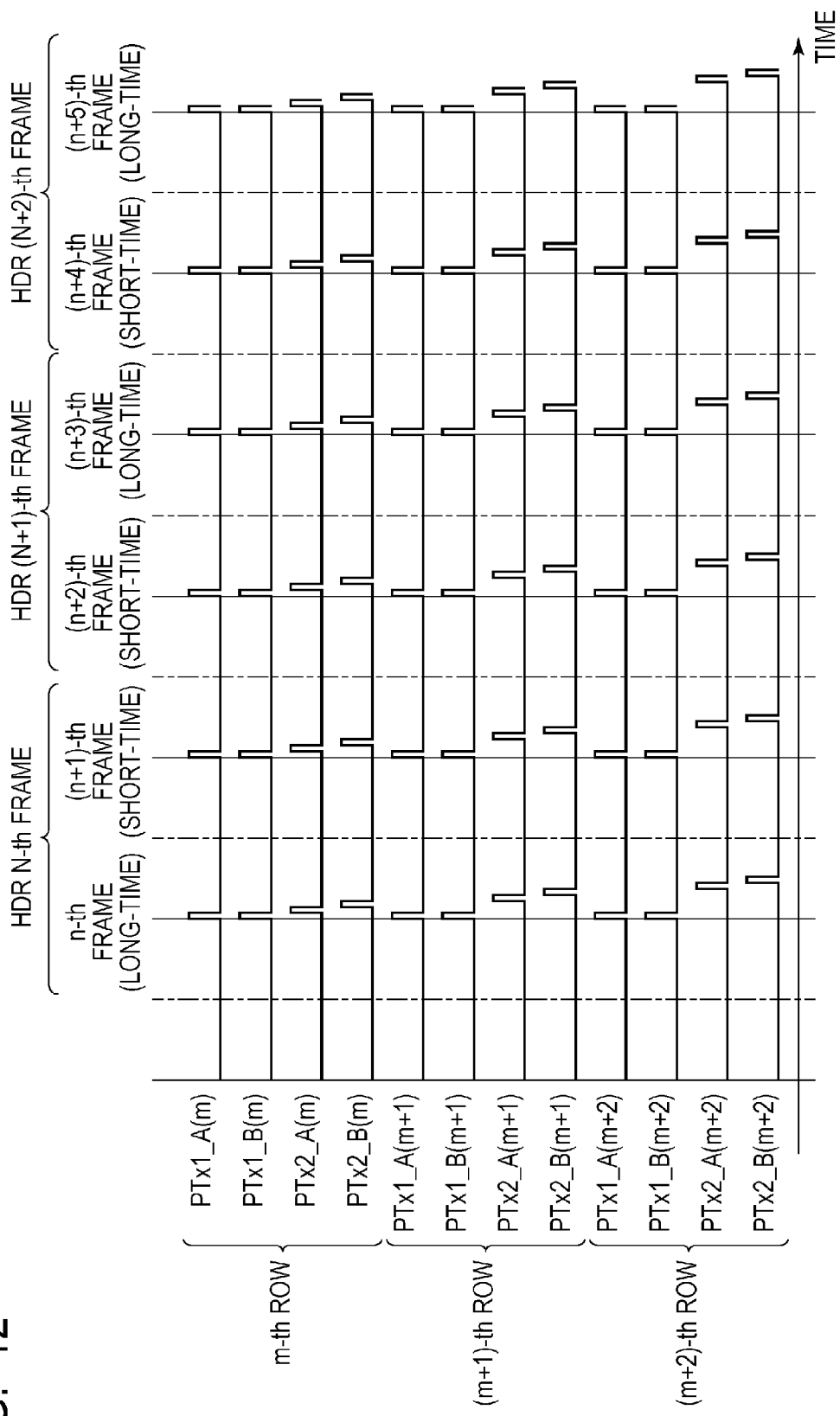
FIG. 12 is a timing chart illustrating the method for driving the imaging device according to the second embodiment of the present invention.

FIG. 8 is a diagram illustrating an example configuration of pixel circuits of the imaging device according to the present embodiment. FIG. 9 is a schematic diagram illustrating an example plan-view layout of a pixel array unit of the imaging device according to the present embodiment. FIG. 10 is a cross-sectional view illustrating an example pixel structure in the imaging device according to the present embodiment. FIG. 11 is a schematic view illustrating a method for driving the imaging device according to the present embodiment. FIG. 12 is a timing chart illustrating the method for driving the imaging device according to the present embodiment.

First, a description is given of the configuration of the imaging device according to the present embodiment with reference to FIGS. 8 to 10.

The imaging device according to the present embodiment is different from the imaging device according to the first embodiment in the circuitry of the pixels 12, as illustrated in FIG. 8. Specifically, the pixels 12 of the imaging device of the present embodiment are different from those of the first embodiment in that each pixel 12 further includes a transfer transistor M21 between the transfer transistor M11 and the FD region and a transfer transistor M22 between the transfer transistor M12 and the FD region.

The transfer transistor M21 has its source connected to the drain of the transfer transistor M11 and its drain connected to the FD region (the source of the reset transistor M3 and the gate of the amplifier transistor M4). The gate of the transfer transistor M21 is connected to a control line Tx2_A, which is one signal line in the control signal line 14. A capacitance component parasitically coupled to the connection node between the drain of the transfer transistor M11 and the source of the transfer transistor M21 has a function as a charge holding unit. In FIG. 8, this capacitance component is denoted by a capacitor (C2) connected to the connection node between the drain of the transfer transistor M11 and the source of the transfer transistor M21. In the following description, this node may be referred to as a holding unit C2.

The transfer transistor M22 has its source connected to the drain of the transfer transistor M12 and its drain connected to the FD region (the source of the reset transistor M3 and the gate of the amplifier transistor M4). The gate of the transfer transistor M22 is connected to a control line Tx2_B, which is one signal line in the control signal line 14. A capacitance component parasitically coupled to the connection node between the drain of the transfer transistor M12 and the source of the transfer transistor M22 has a function as a charge holding unit. In FIG. 8, this capacitance component is denoted by a capacitor (C3) connected to the connection node between the drain of the transfer transistor M12 and the source of the transfer transistor M22. In the following description, this node may be referred to as a holding unit C3.

FIG. 9 is a schematic diagram illustrating an example plan-view layout of the pixel array unit 10. FIG. 9 illustrates blocks of the circuit elements forming a pixel circuit to represent their locations within a unit pixel area. In FIG. 9, the block denoted by reference sign M21 represents the location of the transfer transistor M21. The block denoted by reference sign M22 represents the location of the transfer transistor M22. The block denoted by reference sign C2 represents the location of the holding unit C2. The block denoted by reference sign C3 represents the location of the holding unit C3. The other blocks are denoted in the same way as those in FIG. 3.

The photoelectric conversion unit D1 and the photoelectric conversion unit D2 are arranged adjacently to align in the X direction. The photoelectric conversion unit D1, the transfer transistor M11, the holding unit C2, the transfer transistor M21, and the holding unit C1 are arranged adjacently to align in the Y direction in the order mentioned. The photoelectric conversion unit D2, the transfer transistor M12, the holding unit C3, the transfer transistor M22, and the holding unit C1 are arranged adjacently to align in the Y direction in the order mentioned. A light shield film 228 is provided above the holding units C2, C3. The other circuit elements Cir are arranged on the outer sides of the photoelectric conversion units D1, D2.

FIG. 10 is a schematic cross-sectional view taken along the line A-A' in FIG. 9.

The transfer transistor M12 includes the n-type semiconductor region 210 as a source region and an n-type semiconductor region 224 as a drain region. The n-type semiconductor region 224 also acts as the holding unit C3. The gate electrode 218 of the transfer transistor M12 is provided over the semiconductor substrate 200 with a gate insulating film interposed therebetween, in an area between the n-type semiconductor region 210 and the n-type semiconductor region 224. The transfer transistor M22 includes the n-type semiconductor region 224 as a source region and the n-type semiconductor region 216 as a drain region. The n-type semiconductor region 216 also acts as the holding unit C1. A gate electrode 226 of the transfer transistor M22 is provided over the semiconductor substrate 200 with a gate insulating film interposed therebetween, in an area between the n-type semiconductor region 224 and the n-type semiconductor region 216. The light shield film 228 is provided above the semiconductor substrate 200 having thereon elements such as the photoelectric conversion units D1, D2 and the transfer transistor M12, M22, the light shield film 228 covering the holding units C2, C3 entirely and exposing at least part of the photoelectric conversion units D1, D2. The other configurations are the same as those in the first embodiment illustrated in FIG. 4.

With the configuration described above, not only can the pixels 12 be used as focus detection pixels for the phase detection autofocus that detects the phase difference in the X direction as those of the imaging device according to the first embodiment, but the imaging device can also perform global electronic shutter operation.

Next, a method for driving the imaging device according to the present embodiment will be described with reference to FIGS. 11 and 12.

FIG. 11 is a schematic diagram illustrating how the operation state of the imaging device transitions with time.

FIG. 11 illustrates operation states in six frames: an n-th frame to an (n+5)-th frame. In FIG. 11, "PD_A" represents an exposure period of the photoelectric conversion unit D1, and "PD_B" represents an exposure period of the photoelectric conversion unit D2. "MEM_A" represents a period of time when the holding unit C2 holds charges transferred from the photoelectric conversion unit D1, and "MEM_B" represents a period of time when the holding unit C3 holds charges transferred from the photoelectric conversion unit D2. "READ" represents a signal readout period.

FIG. 12 is a timing chart illustrating the operations of the transfer transistors M11, M12, M21, M22. The operations of the transfer transistors M11, M12, M21, M22 in FIG. 12 correspond to the schematic diagram in FIG. 11. In FIG. 12, the control signal PTx1_A is a control signal supplied to the gate of the transfer transistor M11, and the control signal PTx1_B is a control signal supplied to the gate of the transfer transistor M12. A control signal PTx2_A is a control signal supplied to the gate of the transfer transistor M21, and a control signal PTx2_B is a control signal supplied to the gate of the transfer transistor M22. The signs (m), (m+1), and (m+2) added to the reference signs of these control signals represent the row numbers. These control signals turn the corresponding transfer transistors on when at a high level, and turn the corresponding transfer transistors off when at a low level.

The imaging device according to the present embodiment includes the holding unit C2 between the photoelectric conversion unit D1 and the FD region (the holding unit C1) to be able to hold charges at a place other than the photoelectric conversion unit D1 and the holding unit C1. The imaging device according to the present embodiment further includes the holding unit C3 between the photoelectric conversion unit D2 and the FD region (the holding unit C1) to be able to hold charges at a place other than the photoelectric conversion unit D2 and the holding unit C1. This configuration allows signal charges in the photoelectric conversion units D1, D2 to be temporarily held by the holding units C2, C3 before being read out to the FD region.

Thus, transfer of charges from the photoelectric conversion unit D1 to the holding unit C2 (the period when the control signal PTx1_A is at a high level) and transfer of charges from the photoelectric conversion unit D2 to the holding unit C3 (the period when the control signal PTx1_B is at a high level) can be performed at the same time. This enables the photoelectric conversion unit D1 and the photoelectric conversion unit D2 to be exposed to light at the same timing to obtain the two parallax images. Thereby, autofocus with resistance to motion blur can be achieved, improving the autofocus performance.

While signals are read out from the holding units C2, C3 to the FD region (the holding unit C1) ("READ" in FIG. 11, the control signals PTx2_A and PTx2_B are being supplied) on a row-by-row basis, charges can accumulate in the holding units C2, C3. This allows the same exposure period to be used for the plurality of pixel rows, meaning that global electronic shutter operation is possible. A distortion-free image can be obtained even for a fast-moving or rotating object, and therefore image quality improves.

As in the first embodiment, the long-exposure-period frame and the short-exposure-period frame can be switched in order in the present embodiment. Thus, the imaging device can acquire moving images with a wide dynamic range while achieving high-speed, fine autofocus suitable for the conditions of the object.

As described thus far, according to the present embodiment, an imaging device with an image plane phase detection autofocus function can obtain wide dynamic range moving images while achieving high-performance autofocus.

Third Embodiment

An imaging device and a method for driving the same according to a third embodiment of the present invention will be described with reference to FIGS. 13 to 16. Components that are the same as those in the imaging devices according to the first and second embodiments illustrated in FIGS. 1 to 12 are denoted by the same reference signs as those used in the first and second embodiments, and are either not described or described only briefly.

Figure 13:
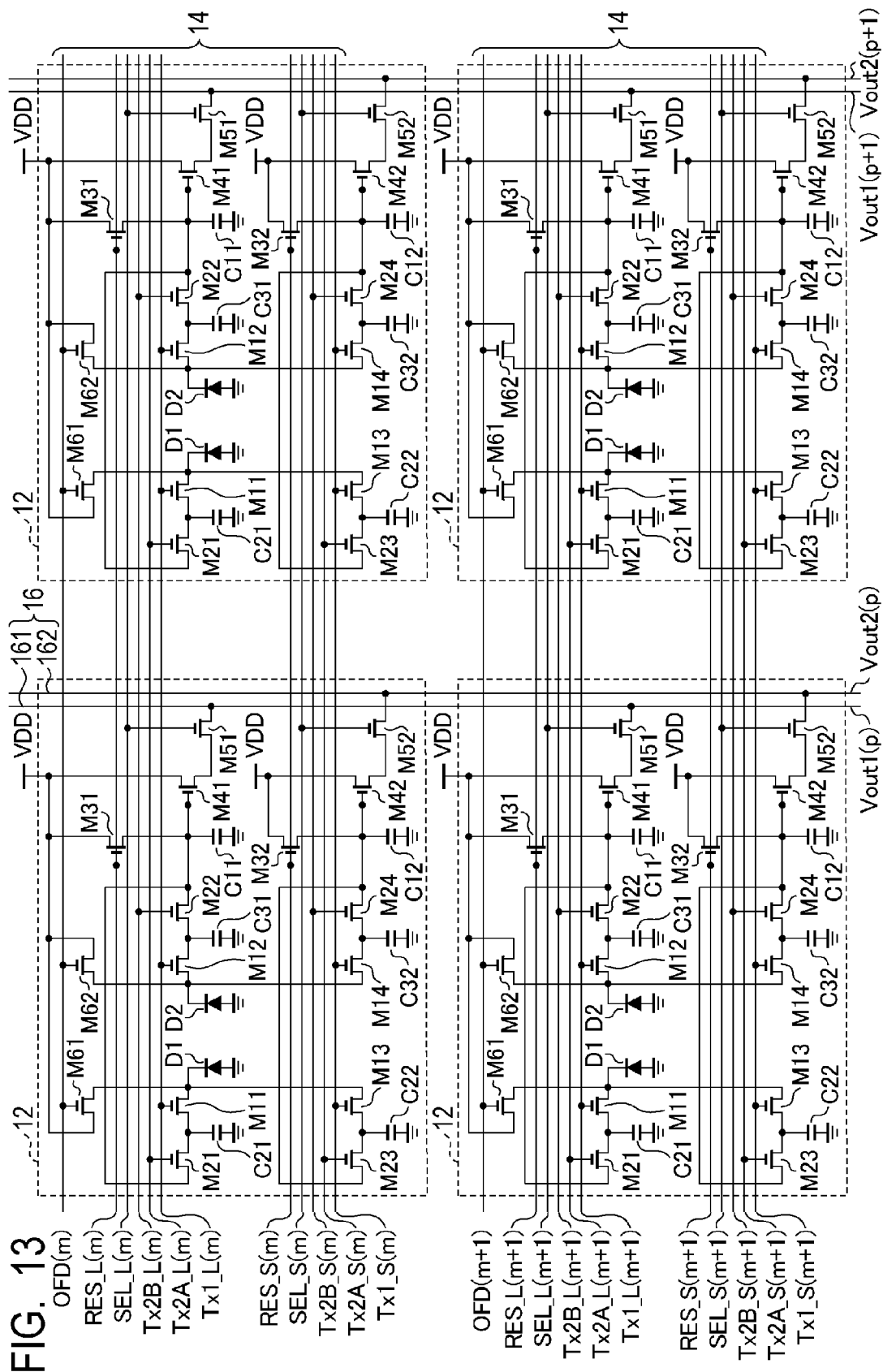
FIG. 13 is a diagram illustrating an example of configuration of a pixel circuit of an imaging device according to a third embodiment of the present invention.
Figure 14:
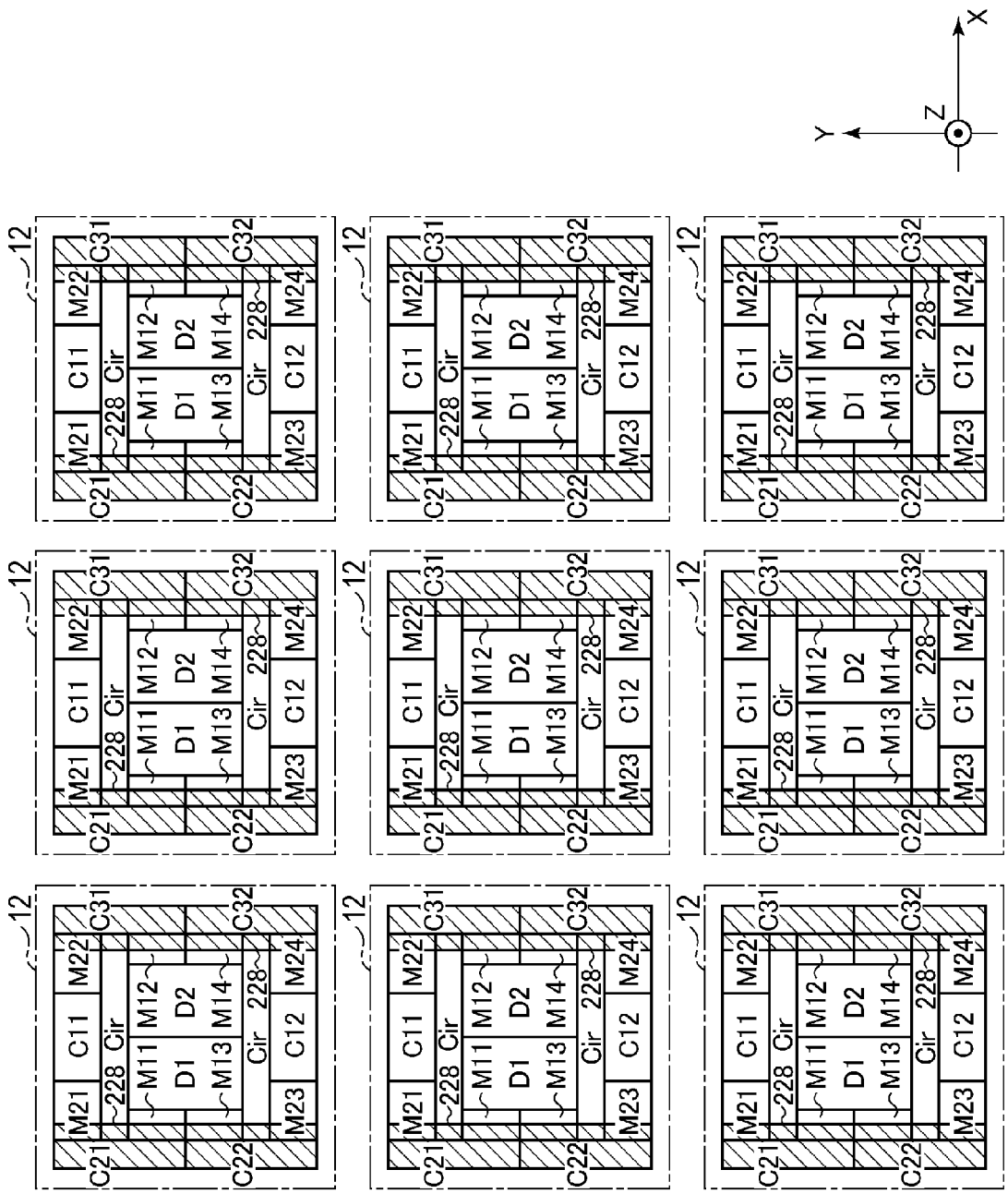
FIG. 14 is a schematic diagram illustrating an example of a plan-view layout of a pixel array unit of the imaging device according to the third embodiment of the present invention.
Figure 15:
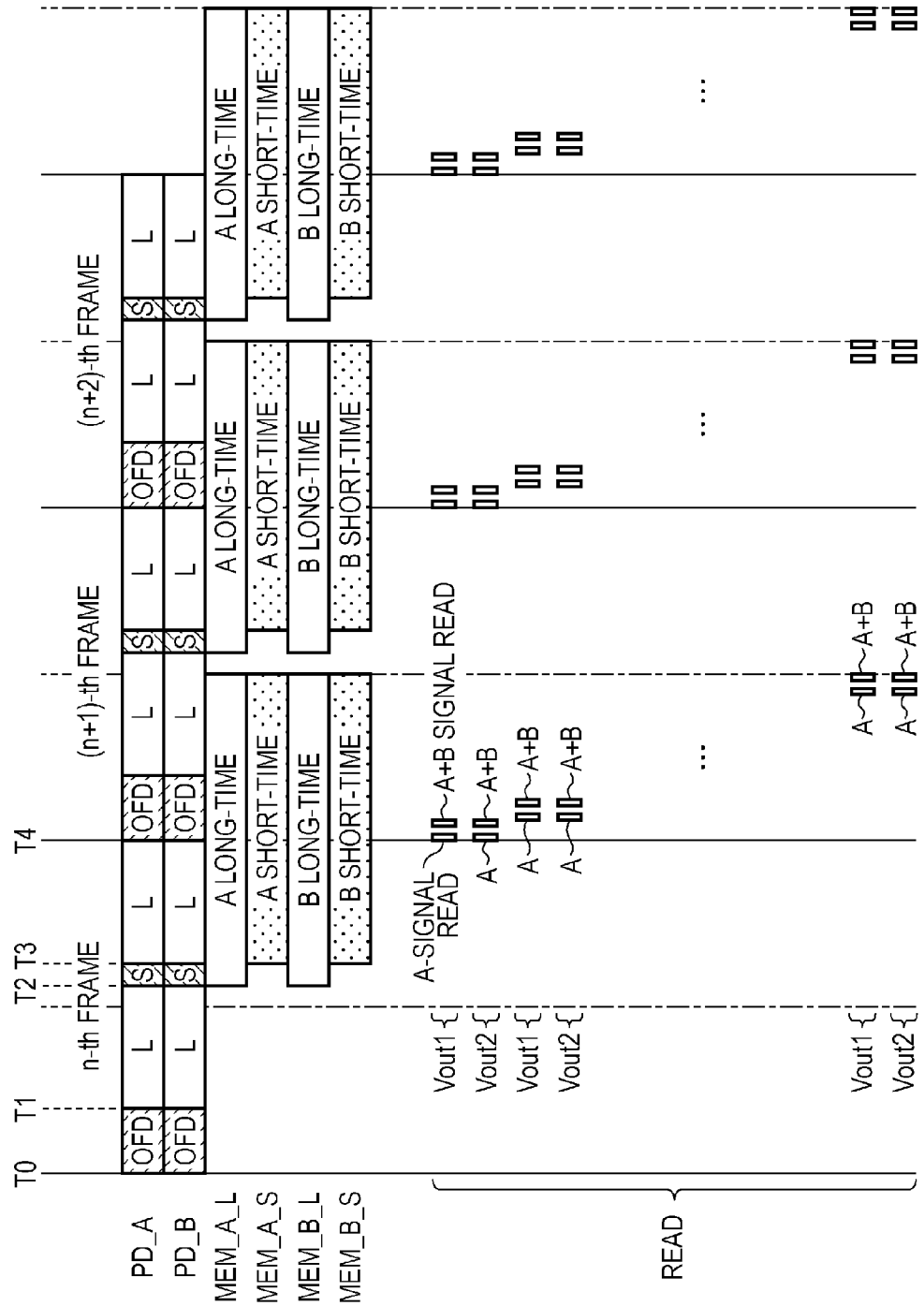
FIG. 15 is a schematic view illustrating a method for driving the imaging device according to the third embodiment of the present invention.
Figure 16:
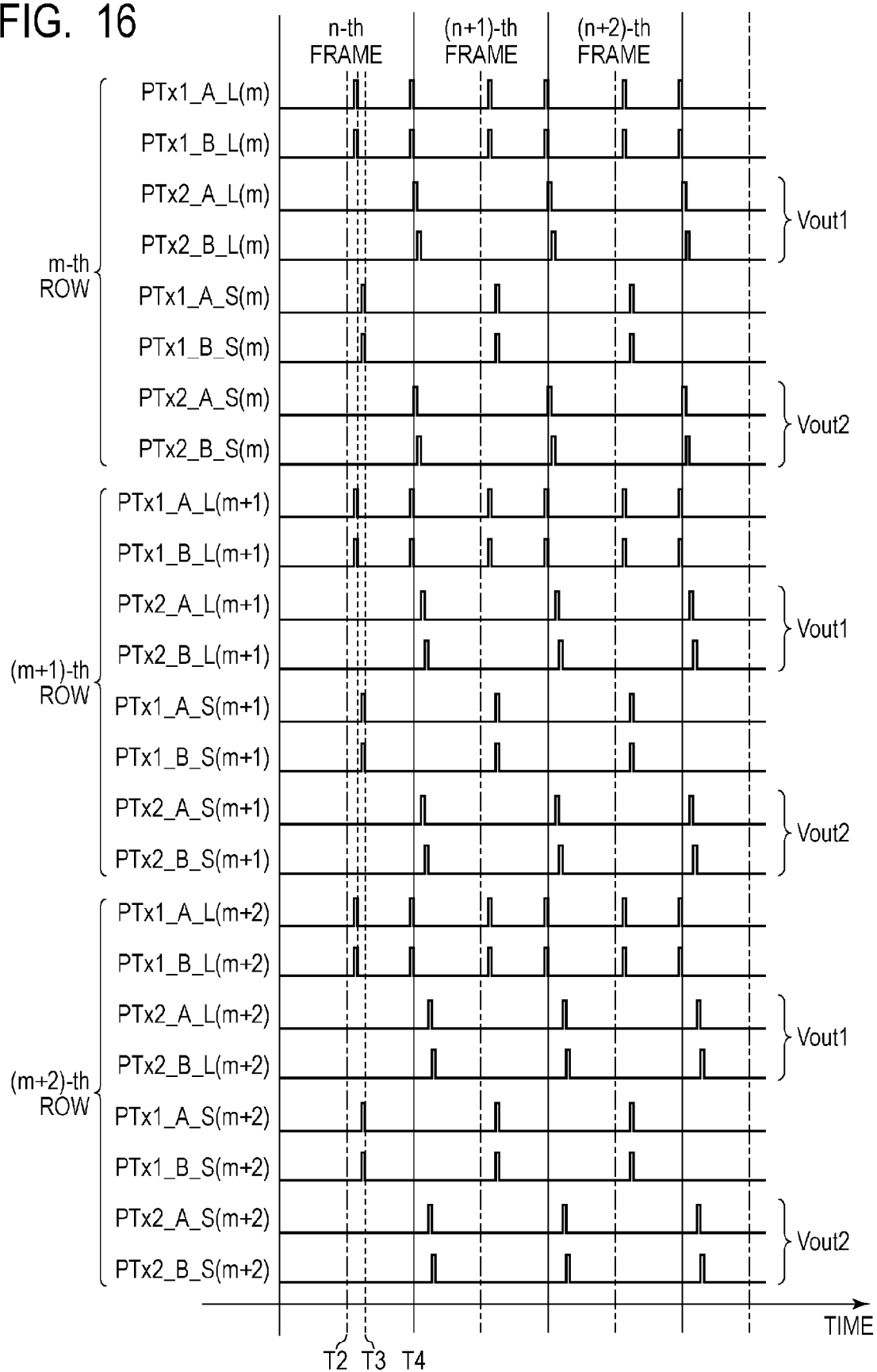
FIG. 16 is a timing chart illustrating the method for driving the imaging device according to the third embodiment of the present invention.

FIG. 13 is a diagram illustrating an example configuration of pixel circuits of the imaging device according to the present embodiment. FIG. 14 is a schematic diagram illustrating an example plan-view layout of a pixel array unit of the imaging device according to the present embodiment. FIG. 15 is a schematic view illustrating a method for driving the imaging device according to the present embodiment. FIG. 16 is a timing chart illustrating the method for driving the imaging device according to the present embodiment.

First, a description is given of the configuration of the imaging device according to the present embodiment with reference to FIGS. 13 and 14.

The imaging device according to the present embodiment is different from the imaging device according to the first or second embodiment in the circuitry of the pixels 12, as illustrated in FIG. 13. Specifically, the pixels 12 of the imaging device of the present embodiment each include an in-pixel readout circuit similar to one in the second embodiment for each of the photoelectric conversion units D1, D2, and also includes a charge draining transistors that initialize the photoelectric conversion units D1, D2.

To be more specific, the photoelectric conversion unit D1, which is a photodiode, has its anode connected to the grounded voltage line and its cathode connected to the source of the transfer transistor M11, the source of a transfer transistor M13, and the source of a charge draining transistor M61. The drain of the transfer transistor M11 is connected to the source of the transfer transistor M21. A capacitance component parasitically coupled to the connection node between the drain of the transfer transistor M11 and the source of the transfer transistor M21 forms a holding unit C21. The drain of the transfer transistor M13 is connected to the source of a transfer transistor M23. A capacitance component parasitically coupled to the connection node between the drain of the transfer transistor M13 and the source of the transfer transistor M23 forms a holding unit C22.

The photoelectric conversion unit D2, which is a photodiode, has its anode connected to the grounded voltage line and its cathode connected to the source of the transfer transistor M12, the source of a transfer transistor M14, and the source of a charge draining transistor M62. The drain of the transfer transistor M12 is connected to the source of the transfer transistor M22. A capacitance component parasitically coupled to the connection node between the drain of the transfer transistor M12 and the source of the transfer transistor M22 forms a holding unit C31. The drain of the transfer transistor M14 is connected to the source of a transfer transistor M24. A capacitance component parasitically coupled to the connection node between the drain of the transfer transistor M14 and the source of the transfer transistor M24 forms a holding unit C32.

The drains of the transfer transistors M21, M22 are connected to the source of a reset transistor M31 and the gate of an amplifier transistor M41. The node where the drains of the transfer transistors M21, M22, the source of the reset transistor M31, and the gate of the amplifier transistor M41 connect is an FD region forming a holding unit C11. The source of the amplifier transistor M41 is connected to the drain of a select transistor M51.

The drains of the transfer transistors M23, M24 are connected to the source of a reset transistor M32 and the gate of an amplifier transistor M42. The node where the drains of the transfer transistors M23, M24, the source of the reset transistor M32, and the gate of the amplifier transistor M42 connect forms an FD region forming a holding unit C12. The source of the amplifier transistor M42 is connected to the drain of a select transistor M52.

The drains of the reset transistors M31, M32, the drains of the amplifier transistors M41, M42, and the drains of the charge draining transistors M61, M62 are connected to the power supply voltage line (VDD). The source of the select transistor M51 is connected to an output line 161. The source of the select transistor M52 is connected to an output line 162.

The control signal lines 14 for each row include control lines Tx1_L, Tx2A_L, Tx2B_L, RES_L, SEL_L, Tx1_S, Tx2A_S, Tx2B_S, RES_S, SEL_S, and OFD. The control line Tx1_L is connected to the gates of the transfer transistors M11, M12 of the pixels 12 in the corresponding row. Separate control lines may be connected to the respective gates of the transfer transistors M11, M12. The control line Tx2A_L is connected to the gates of the transfer transistors M21 of the pixels 12 in the corresponding row. The control line Tx2B_L is connected to the gates of the transfer transistors M22 of the pixels 12 in the corresponding row. The control line RES_L is connected to the gates of the reset transistors M31 of the pixels 12 in the corresponding row. The control line SEL_L is connected to the gates of the select transistors M51 of the pixels 12 in the corresponding row. The control line Tx1_S is connected to the gates of the transfer transistors M13, M14 of the pixels 12 in the corresponding row. Alternatively, separate control lines may be connected to the respective gates of the transfer transistors M13, M14. The control line Tx2A_S is connected to the gates of the transfer transistors M23 of the pixels 12 in the corresponding row. The control line Tx2B_S is connected to the gates of the transfer transistors M24 of the pixels 12 in the corresponding row. The control line RES_S is connected to the gates of the reset transistors M32 of the pixels 12 in the corresponding row. The control line SEL_S is connected to the gates of the select transistors M52 of the pixels 12 in the corresponding row. The control line OFD is connected to the gates of the charge draining transistors M61, M62 of the pixels 12 in the corresponding row.

FIG. 14 is a schematic diagram illustrating an example plan-view layout of the pixel array unit 10. FIG. 14 illustrates blocks of the circuit elements forming a pixel circuit to represent their locations within a unit pixel area. In FIG. 14, the blocks denoted by reference signs M13, M14, M23, and M24 represent the locations of the transfer transistors M13, M14, M23, and M24, respectively, and the blocks denoted by reference signs C11, C12, C21, C22, C31, and C32 represent the locations of the holding units C11, C12, C21, C22, C31, and C32, respectively. The other reference signs represent the locations as they are described with reference to FIG. 9.

The photoelectric conversion unit D1 and the photoelectric conversion unit D2 are arranged adjacently to align in the X direction. On the −X direction side of the photoelectric conversion unit D1, the holding unit C21 and the holding unit C22 are arranged with the transfer transistor M11 and the transfer transistor M13 interposed, respectively. On the +X direction side of the photoelectric conversion unit D2, the holding unit C31 and the holding unit C32 are arranged with the transfer transistor M12 and the transfer transistor M14 interposed, respectively. Between the holding unit C21 and the holding unit C31, the transfer transistor M21, the holding unit C11, and the transfer transistor M22 are arranged adjacently to align in the X direction. Between the holding unit C22 and the holding unit C32, the transfer transistor M23, the holding unit C12, and the transfer transistor M24 are arranged adjacently to align in the X direction. The other circuit elements Cir are provided between a group containing the transfer transistor M11, the photoelectric conversion units D1, D2, and the transfer transistor M12 and a group containing the transfer transistor M21, the holding unit C11, and the transfer transistor M22. The other circuit elements Cir are also provided between a group containing the transfer transistor M13, the photoelectric conversion units D1, D2, and the transfer transistor M14 and a group containing the transfer transistor M23, the holding unit C12, and the transfer transistor M24. The holding units C21, C22, C31, C32 are covered with the light shield film 228.

This way, the holding unit C21 connected to the photoelectric conversion unit D1 and the holding unit C31 connected to the photoelectric conversion unit D2 share the holding unit C11, the amplifier transistor M41, the select transistor M51, and the output line 161 which form a charge readout path. The holding unit C22 connected to the photoelectric conversion unit D1 and the holding unit C32 connected to the photoelectric conversion unit D2 share the holding unit C12, the amplifier transistor M42, the select transistor M52, and the output line 162 which form a charge readout path. Such a configuration can reduce the number of elements and enhance the performance of the pixel 12 by, for example, increasing the areas of the photoelectric conversion units D1, D2. In addition, the provision of the charge draining transistors M61, M62 for controlling the charge accumulation in the photoelectric conversion units D1, D2 improves the controllability of the exposure periods for the photoelectric conversion units D1, D2.

Next, a method for driving the imaging device according to the present embodiment will be described with reference to FIGS. 15 and 16.

FIG. 15 is a schematic diagram illustrating how the operation state of the imaging device transitions with time. FIG. 15 illustrates operation states in three frames: an n-th frame to an (n+2)-th frame which, in the driving method of the present embodiment, form an HDR frame.

In FIG. 15, "PD_A" represents an exposure period of the photoelectric conversion unit D1, and "PD_B" represents an exposure period of the photoelectric conversion unit D2. In each of the "PD_A" and "PD_B" periods, a period denoted by "L" is a long exposure period, a period denoted by "S" is a short exposure period, and a period denoted by "OFD" is a charge draining period.

"MEM_A_L" represents a holding period when the holding unit C21 holds the charges generated by the photoelectric conversion unit D1 during the long exposure period "L" of the photoelectric conversion unit D1 (PD_A). "MEM_A_S" represents a holding period when the holding unit C22 holds the charges generated by the photoelectric conversion unit D1 during the short exposure period "S" of the photoelectric conversion unit D1 (PD_A). "MEM_B_L" represents a holding period when the holding unit C31 holds the charges generated by the photoelectric conversion unit D2 during the long exposure period "L" of the photoelectric conversion unit D2 (PD_B). "MEM_B_S" represents a holding period when the holding unit C32 holds the charges generated by the photoelectric conversion unit D2 during the short exposure period "S" of the photoelectric conversion unit D2 (PD_B).

"READ" represents a signal readout period. "Vout1" represents an operation of reading out to the output line 161 a signal based on charges accumulated during the long exposure period, and "Vout2" represents an operation of reading out to the output line 162 a signal based on charges accumulated during the short exposure period.

FIG. 16 is a timing chart illustrating the operations of the transfer transistors M11, M12, M13, M14, M21, M22, M23, M24. The operations of the transfer transistors M11, M12, M13, M14, M21, M22, M23, M24 in FIG. 16 correspond to the schematic diagram in FIG. 15. In FIG. 16, a control signal PTx1_A_L is a control signal supplied to the gate of the transfer transistor M11, and a control signal PTx1_B_L is a control signal supplied to the gate of the transfer transistor M12. A control signal PTx2_A_L is a control signal supplied to the gate of the transfer transistor M21, and a control signal PTx2_B_L is a control signal supplied to the gate of the transfer transistor M22. A control signal PTx1_A_S is a control signal supplied to the gate of the transfer transistor M13, and a control signal PTx1_B_S is a control signal supplied to the gate of the transfer transistor M14. A control signal PTx2_A_S is a control signal supplied to the gate of the transfer transistor M23, and a control signal PTx2_B_S is a control signal supplied to the gate of the transfer transistor M24. The signs (m), (m+1), and (m+2) added to the reference signs of these control signals represent the row numbers. These control signals turn the corresponding transfer transistors on when at a high level, and turn the corresponding transfer transistors off when at a low level.

At time T0, at which the n-th frame starts, the charge draining transistors M61, M62 are on, which means that the photoelectric conversion units D1, D2 are draining charges ("OFD" in FIG. 15).

Next, at time T1, the vertical scanning circuit 20 controls a control signal POFD and changes it from high level to low level, turning the charge draining transistors M61, M62 of the pixels 12 off. This stops the photoelectric conversion units D1, D2 from draining charges, and charges start accumulating.

Next, at time T2, the vertical scanning circuit 20 controls the control signals PTx1_A_L, PTx1_B_L and changes them from low level to high level, turning the transfer transistors M11, M12 on. Thereby, the signal charges generated by the photoelectric conversion units D1, D2 during the long exposure period, which corresponds to the period from time T1 to time T2 ("L" in FIG. 15), are transferred to the holding units C21, C31, respectively. As illustrated in FIG. 16, the transfer transistors M11, M12 are turned off promptly at the timing when the charge transfer completes. Strictly, the long exposure period ends at a timing when the transfer transistors M11, M12 are turned off. When the signal charges are transferred from the photoelectric conversion units D1, D2 to the holding units C21, C31, the photoelectric conversion units D1, D2 return to their initial states. The photoelectric conversion units D1, D2 then newly start generating and accumulating charges.

Next, at time T3, the vertical scanning circuit 20 controls the control signals PTx1_A_S, PTx1_B_S and changes them from low level to high level, turning on the transfer transistors M13, M14. Thereby, the signal charges generated by the photoelectric conversion units D1, D2 during the short exposure period, which corresponds to the period from time T2 to time T3 ("S" in FIG. 15) are transferred to the holding units C22, C32, respectively. As illustrated in FIG. 16, the transfer transistors M13, M14 are turned off promptly at the timing when the charge transfer completes. Strictly, the short exposure period ends at a timing when the transfer transistors M13, M14 are turned off. When the signal charges are transferred from the photoelectric conversion units D1, D2 to the holding units C22, C32, the photoelectric conversion units D1, D2 return to their initial states. The photoelectric conversion units D1, D2 then newly start generating and accumulating charges.

Next, until time T4, the vertical scanning circuit 20 controls the control signals PTx1_A_L, PTx1_B_L and change them from low level to high level, turning on the transfer transistors M11, M12. Thereby, the signal charges generated by the photoelectric conversion units D1, D2 during the long exposure period, which corresponds to the period from time T3 to time T4 ("L" in FIG. 15), are transferred to the holding units C21, C31, respectively. The signal charges generated during the long exposure period from time T1 to time T2 and the signal charges generated during the long exposure period from time T3 to time T4 are added together at the holding units C21, C31, respectively.

Next, after time T4, the operations of reading out signals from the holding units C21, C31, C22, and C32 are performed sequentially on a row-by-row basis. A signal based on the charges generated by the photoelectric conversion unit D1 and a signal based on the charges generated by the photoelectric conversion unit D2 are read out sequentially at different timings, as they are in the first and second embodiments. This allows parallax images to be obtained to be used for the image plane phase detection autofocus. In the present embodiment, the signal based on the charges accumulated during the long exposure period and the signal based on the charges accumulated during the short exposure period are output using the different output lines 161, 162, and therefore operations for reading out these signals can be performed simultaneously.

As in the first and second embodiments, the driving method in the present embodiment can change the order and timing of reading out signals to suit the conditions of the object. Thus, the signal readout timings are not limited to those illustrated in FIGS. 15 and 16. The signal based on the charges accumulated during the short exposure period may be read out first, as illustrated for example in FIG. 6B. Alternatively, the signal based on the charges accumulated during the long exposure period may be read out first. The driving order may be selected appropriately as it suits the conditions of the object, and may be different between the frames.

After time T4, operations are performed for the (n+1)-th frame, the (n+2)-th frame, and so on in the same manner as for the n-th frame.

The driving method of the present embodiment, like those of the first and second embodiments, can obtain two images: one based on charges accumulated during the long exposure period and one based on charges accumulated during the short exposure period. The method can also obtain two parallax images to be used for the phase detection autofocus. In the driving method according to the present embodiment, each frame has a short exposure period between two long exposure periods. Thereby, the temporal center of the short exposure period and that of the long exposure periods can coincide with each other. Then, for example, moving images of a fast-moving object can be obtained with less motion blur.

There are other possibilities for element sharing than those described in the present embodiment. For example, all the holding units on one pixel may share a floating diffusion capacitor or a charge draining transistor. The above-described advantageous effects can be similarly obtained even if the floating diffusion capacitor is not shared by a plurality of holding units. Thus, any combination of these is possible.

Although one short exposure period is sandwiched by long exposure periods in the present embodiment, more than one short exposure period may be included between the long exposure periods.

As in the first and second embodiments, the present embodiment can also change the timing for exposures and signal readouts. The imaging device can obtain moving images with a wide dynamic range while achieving high-speed, fine autofocus that suits the conditions of the object.

As described thus far, according to the present embodiment, an imaging device with an image plane phase detection autofocus function can obtain wide dynamic range moving images while achieving high-performance autofocus.

Fourth Embodiment

A method for driving an imaging device according to a fourth embodiment of the present invention will be described with reference to FIGS. 17 to 19. Components that are the same as those in the imaging devices according to the first to third embodiments illustrated in FIGS. 1 to 16 are denoted by the same reference signs as those used in the first to third embodiments, and are either not described or described only briefly.

Figure 17:
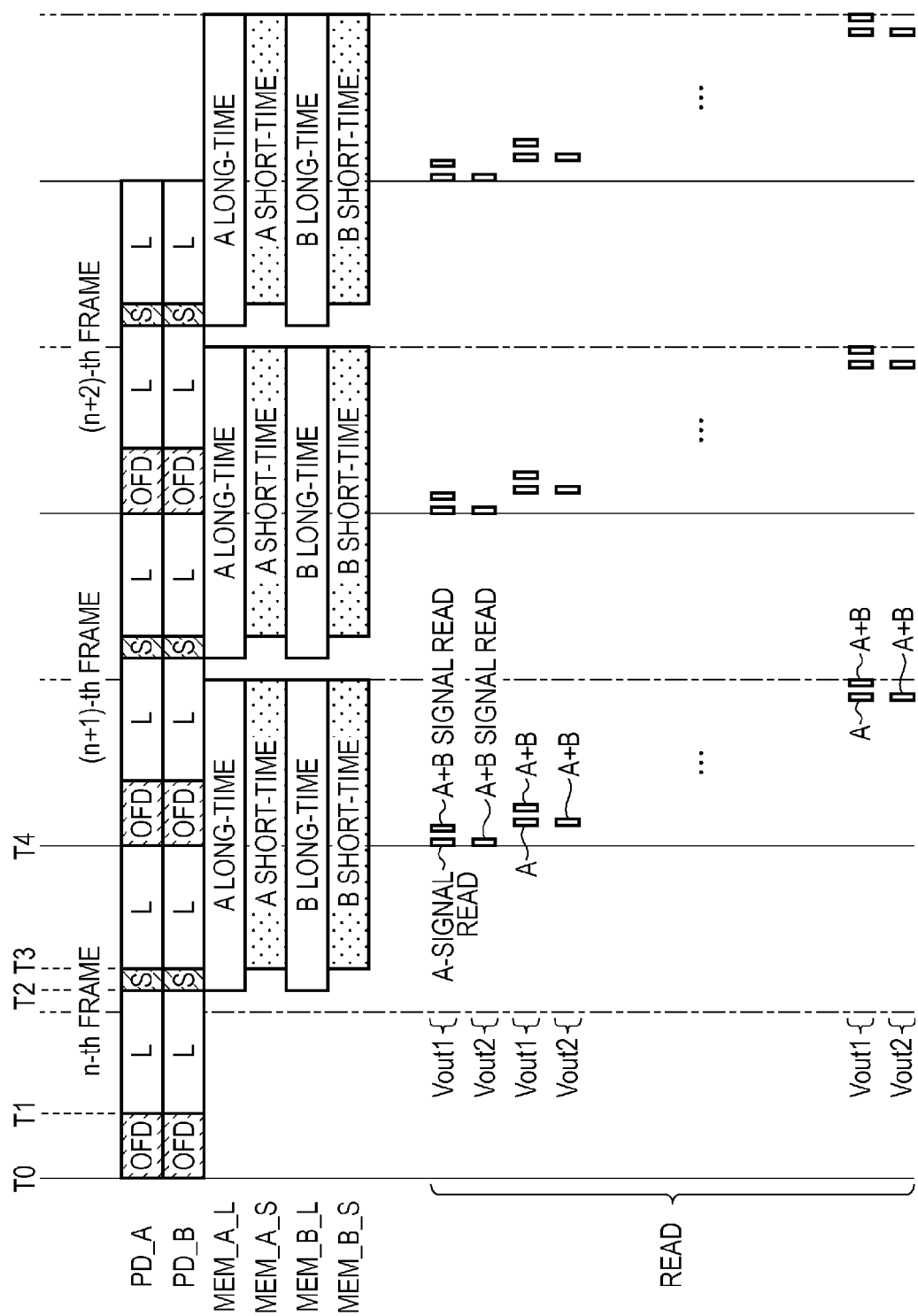
FIG. 17 is a schematic view illustrating a method for driving an imaging device according to a fourth embodiment of the present invention.
Figure 18:
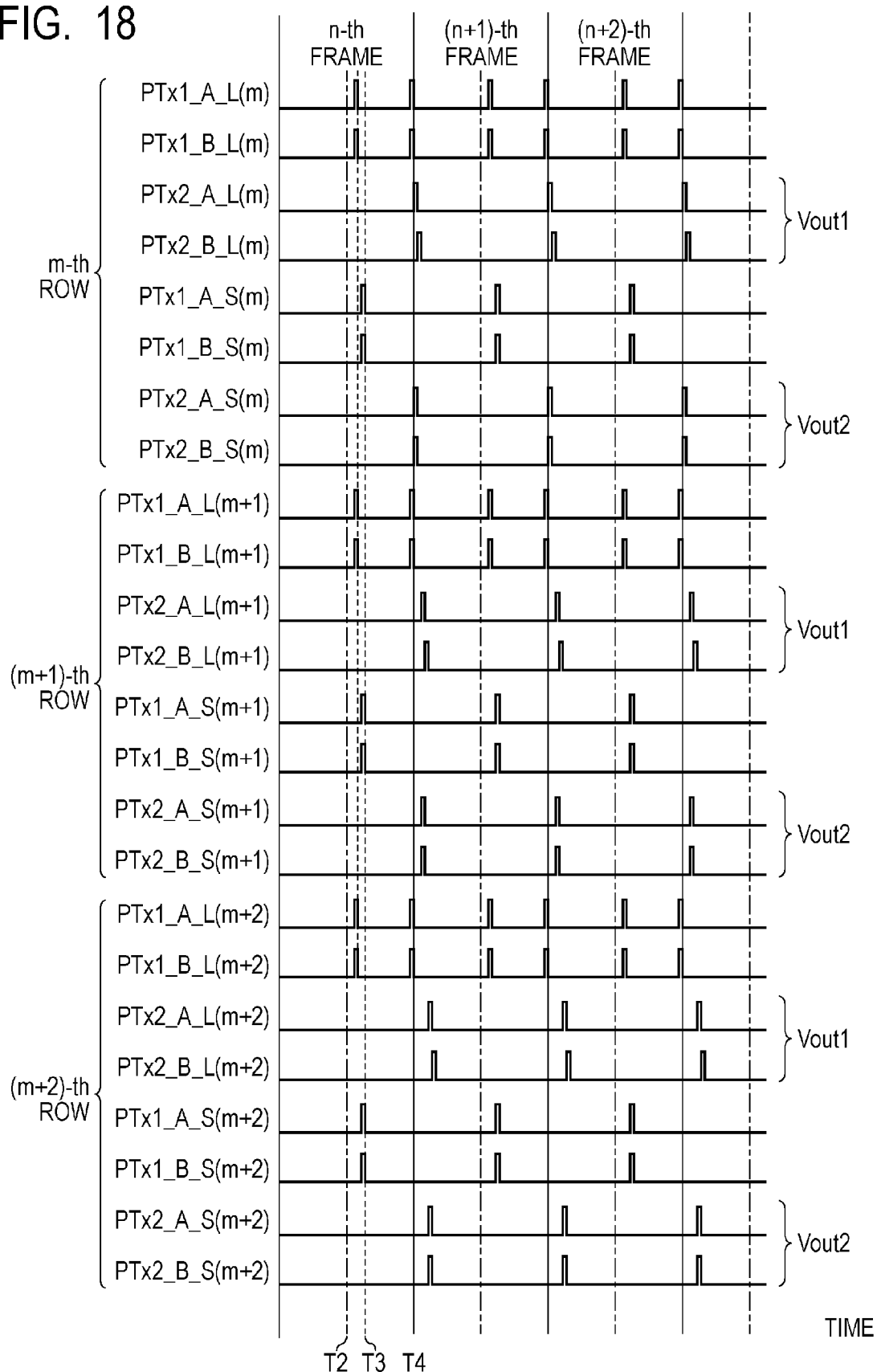
FIGS. 18 and 19 are timing charts illustrating the method for driving the imaging device according to the fourth embodiment of the present invention.

FIG. 17 is a schematic diagram illustrating the method for driving the imaging device according to the present embodiment. FIGS. 18 and 19 are timing charts illustrating the method for driving the imaging device according to the present embodiment.

The present embodiment describes another method for driving the imaging device according to the third embodiment illustrated in FIGS. 13 and 14. The driving method of the present embodiment is different from those of the other embodiments in that for one of a signal based on charges accumulated during the long exposure period and a signal based on charges accumulated during the short exposure period, only an A+B-signal is read out.

FIG. 17 is a schematic diagram illustrating how the operation state of the imaging device transitions with time. FIG. 17 illustrates operation states in three frames: an n-th frame to an (n+2)-th frame. FIG. 18 is a timing chart illustrating the operations of the transfer transistors M11, M12, M13, M14, M21, M22, M23, M24. FIG. 19 is a timing chart illustrating a signal readout operation for one horizontal period.

Unlike the driving method of the third embodiment, the driving method of the present embodiment reads only an A+B-signal as for the signal based on charges accumulated during the short exposure period. On the other hand, in the present embodiment, as for the signal based on charges accumulated during the long exposure period, A-signal and A+B-signal are read out as in the driving method of the third embodiment. Accordingly, in the present embodiment, two kinds of reading operations are performed for each row.

As for the signal based on charges accumulated during the long exposure period, an A-signal and an A+B-signal or an A-signal and a B-signal are read out sequentially at different timings, as illustrated in FIGS. 7A and 7B. Thereby, two types of parallax images can be obtained for use in the phase difference autofocus.

Figure 19:
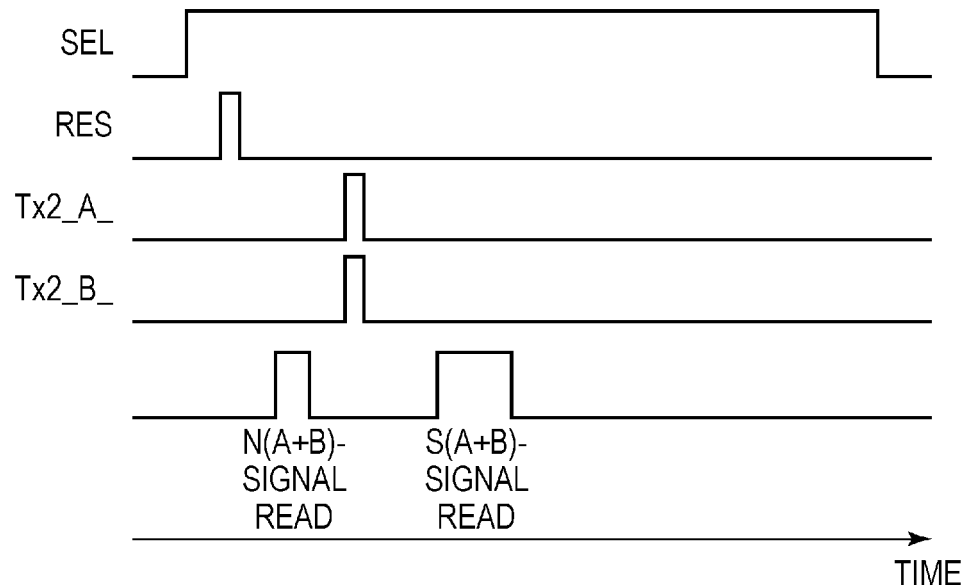

On the other hand, the signal based on charges accumulated during the short exposure period is read out as illustrated in the timing chart in FIG. 19. The readout operation in FIG. 19 sequentially performs selection of the pixel 12, reset, readout of a noise signal ("N(A+B)-SIGNAL READ"), transfer of charges from the photoelectric conversion units D1, D2, and readout of a light signal ("S(A+B)-SIGNAL READ"). In other words, in readout of a signal based on charges accumulated during the short exposure period, as illustrated in FIG. 18 for example, the control signals PTx2_A_S and PTx2_B_S are controlled at the same timing to add the charges together at the FD region. Instead of adding the charges in the FD region, voltage addition or averaging processing may be performed on the signal output to the output line 162. Such an operation enables reduction in the number of operations performed for signals not used for the phase difference autofocus. This can reduce the total power consumed by the imaging device.

As in the first to third embodiments, the driving method of the present embodiment can change the order or timing of reading the signal based on charges accumulated during the long exposure period and the signal based on charges accumulated during the short exposure period to suit the conditions of the object. For example, the signal based on charges accumulated during the long exposure period may be read out first as in the HDR N-th frame in FIG. 6B, or the signal based on charges accumulated during the short exposure period may be read out first as in the HDR (N+1)-th frame in FIG. 6B. The driving order may be appropriately selected to suit the conditions of the object, and may be different between the frames.

A preferred combination of driving methods for the imaging device according to the present embodiment will be described below.

Assume that the imaging device is capturing moving images and determines based on the autofocus result of a previous moving image that a signal based on charges accumulated during the long exposure period is preferable as a signal to be used for the phase difference autofocus. In this case, first, as a signal based on charges accumulated during the long exposure period, the imaging device sequentially reads out a signal based on charges generated by the photoelectric conversion unit D1 and a signal based on charges generated by the photoelectric conversion unit D2, and obtains parallax images with phase difference. Next, as a signal based on charges accumulated during the short exposure period, the imaging device reads out only a signal which is the sum of a signal based on charges generated by the photoelectric conversion unit D1 and a signal based on charges generated by the photoelectric conversion unit D2. This way, while reducing the times of readouts per pixel to decrease the consumed power, the imaging device can achieve high-speed, fine autofocus and acquisition of wide dynamic range images at the same time.

Assume next that the imaging device is capturing moving images and determines based on the autofocus result of a previous moving image that a signal based on charges accumulated during the short exposure period is preferable as a signal to be used for the phase difference autofocus. In this case, first, as a signal based on charges accumulated during the short exposure period, the imaging device sequentially reads a signal based on charges generated by the photoelectric conversion unit D1 and a signal based on charges generated by the photoelectric conversion unit D2, and obtains parallax images with phase difference. Next, as a signal based on charges accumulated during the long exposure period, the imaging device reads out only a signal which is the sum of a signal based on charges generated by the photoelectric conversion unit D1 and a signal based on charges generated by the photoelectric conversion unit D2. This way, while reducing the times of readouts per pixel to decrease the consumed power, the imaging device can achieve high-speed, fine autofocus and acquisition of wide dynamic range images at the same time.

As described thus far, according to the present embodiment, an imaging device with an image plane phase detection autofocus function can obtain wide dynamic range moving images while achieving high-performance autofocus.

Fifth Embodiment

An imaging device and a method for driving the same according to a fifth embodiment of the present invention are described with reference to FIGS. 20 to 22. Components that are the same as those in the imaging devices according to the first to fourth embodiments illustrated in FIGS. 1 to 19 are denoted by the same reference signs as those used in the first to fourth embodiments, and are either not described or described only briefly.

Figure 20:
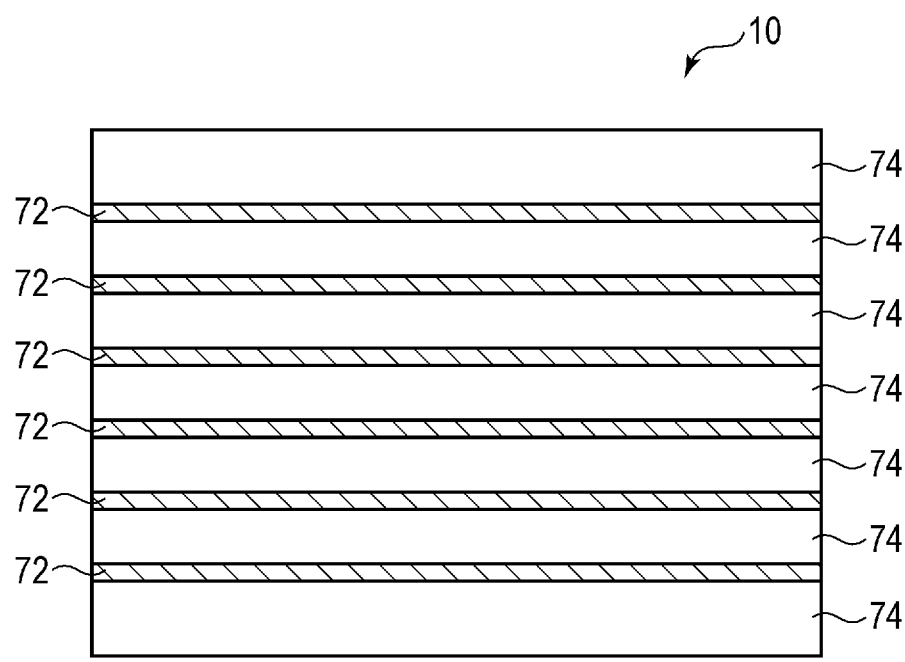
FIG. 20 is a cross-sectional view illustrating an example of a pixel structure of an imaging device according to a fifth embodiment of the present invention.
Figure 21:
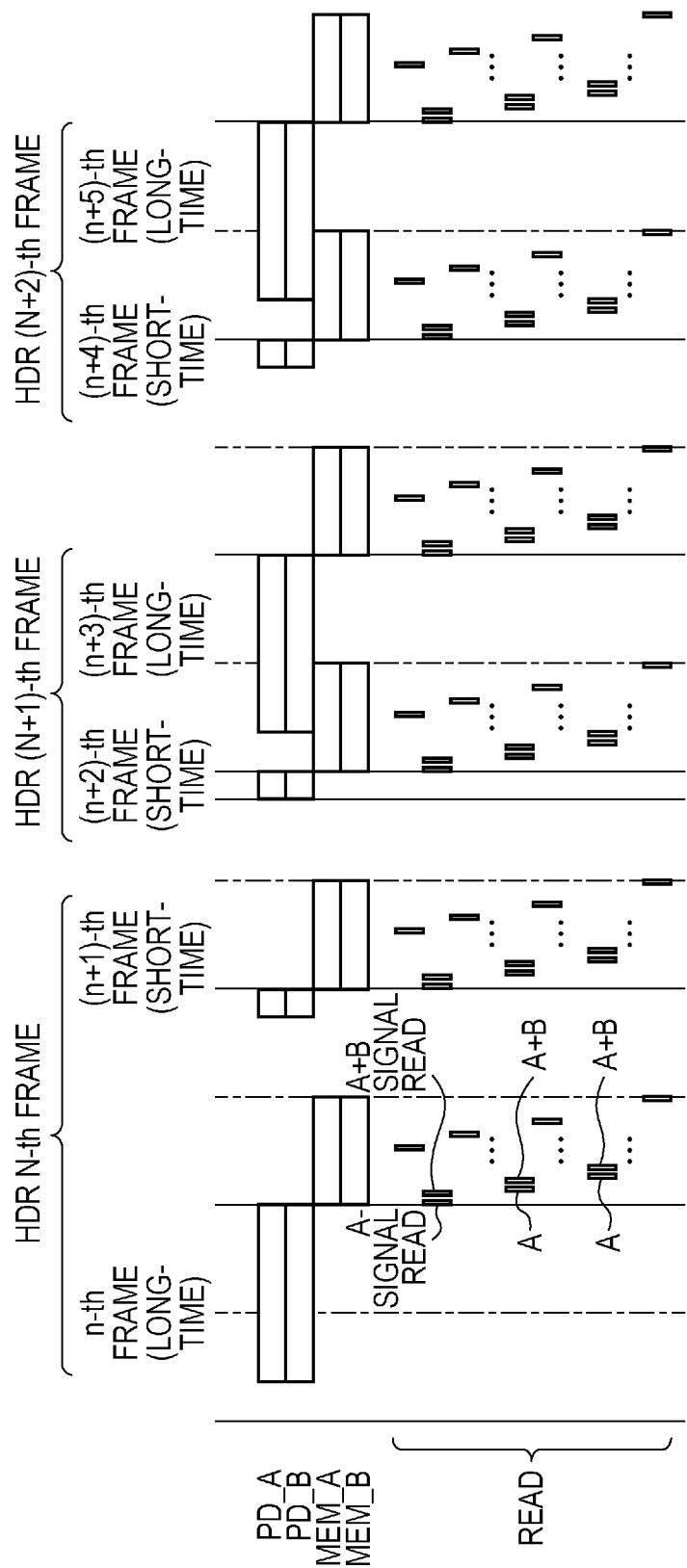
FIG. 21 is a schematic view illustrating a method for driving the imaging device according to the fifth embodiment of the present invention.

FIG. 20 is an example arrangement of the pixels in the pixel array unit in the imaging device according to the present embodiment. FIG. 21 is a schematic diagram illustrating the method for driving the imaging device according to the present embodiment. FIG. 22 is a timing chart illustrating the method for driving the imaging device according to the present embodiment.

The imaging device according to the present embodiment includes, as illustrated in FIG. 20 as an example, pixel rows (AF drive rows) 72, from which signals for phase difference autofocus are output, and pixel rows (imaging drive rows) 74, from which signals for imaging are output.

In the driving method according to the present embodiment, signals are read out preferentially from the pixels 12 that output parallax images used for autofocus, and after the readout from the pixels for autofocus are almost complete, signals are read out from the other pixels 12. In other words, signals are read out from the pixels 12 in the AF drive rows 72 earlier than from the pixels in the imaging drive rows 74, as illustrated in FIG. 21.

Figure 22:
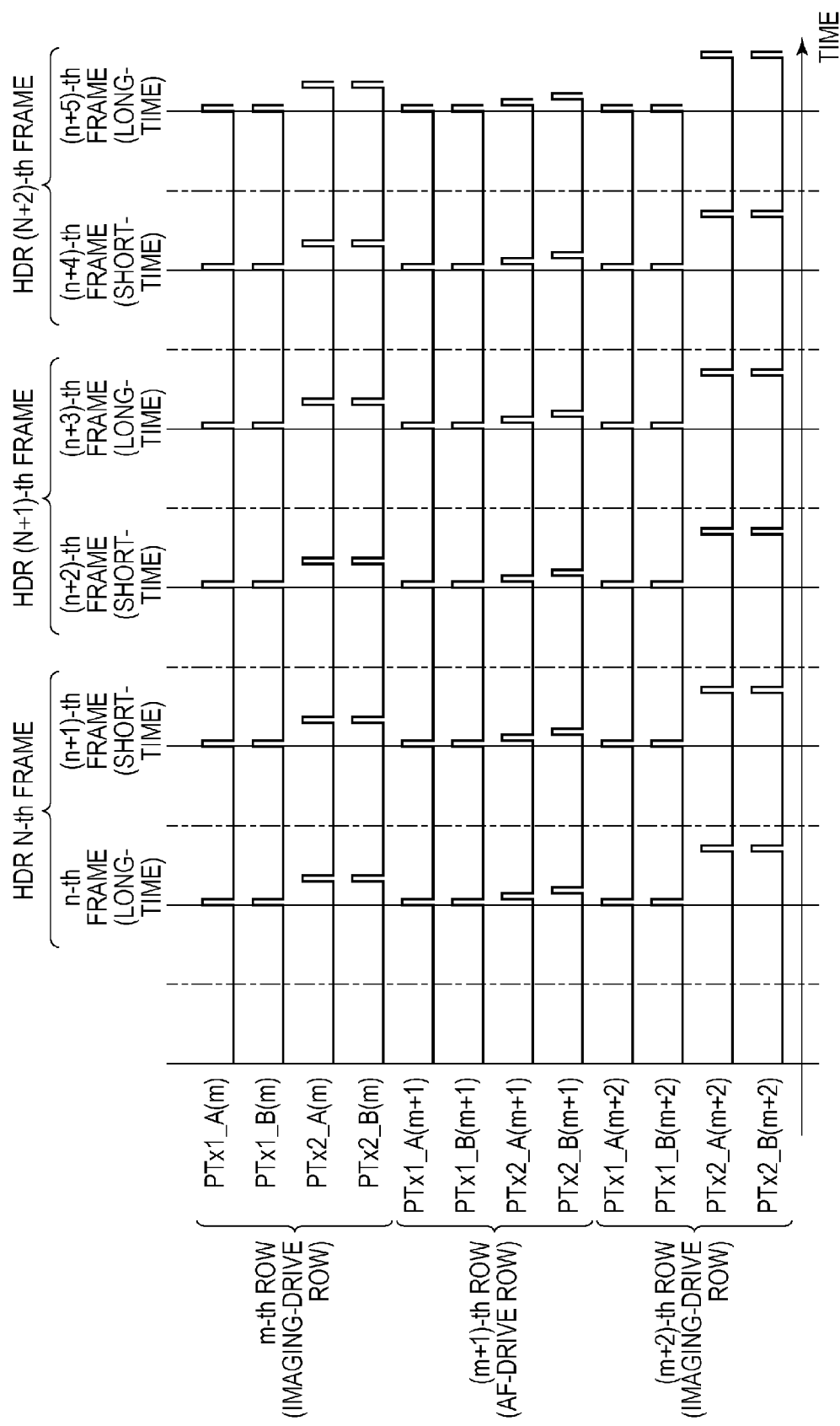
FIG. 22 is a timing chart illustrating the method for driving the imaging device according to the fifth embodiment of the present invention.

For each of the pixels 12 in the (m+1)-th row, which is the AF drive row 72, the high-level control signals PTx2_A and PTx2_B are sequentially supplied, as illustrated in FIG. 22, to acquire an A-signal and a B-signal. For each of the pixels 12 in the m-th row and the (m+2)-th row, which are the imaging drive rows 74, the high-level control signals PTx2_A and PTx2_B are simultaneously supplied to acquire an A+B-signal.

When two kinds of signals (A-signal and B-signal) for phase difference autofocus which are acquired from the AF drive row 72 are added together, the resultant signal can be used as a signal for imaging (A+B signal). Thus, a high-quality image can be obtained with autofocus. When this operation is performed for every pixel row in the pixel array unit 10, wide dynamic range moving images can be obtained with high-performance autofocus.

As described thus far, according to the present embodiment, an imaging device with an image plane phase detection autofocus function can obtain wide dynamic range moving images while achieving high-performance autofocus.

Sixth Embodiment

Figure 23:
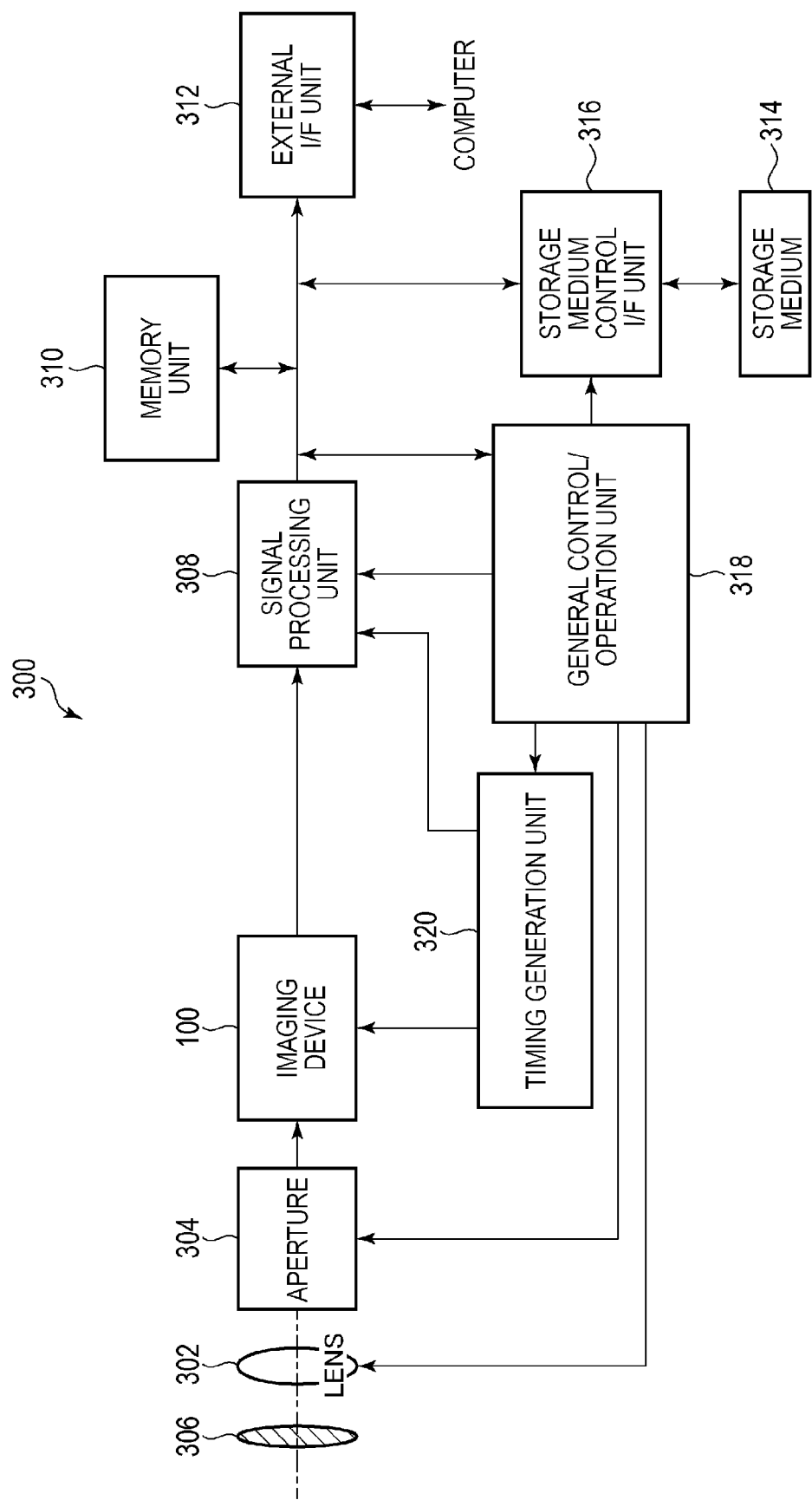
FIG. 23 is a block diagram illustrating the schematic configuration of an imaging system according to a sixth embodiment of the present invention.

An imaging system according to a sixth embodiment of the present invention will be described with reference to FIG. 23. Components that are the same as those in the imaging devices according to the first to fifth embodiments illustrated in FIGS. 1 to 22 are denoted by the same reference signs as those used in the first to fifth embodiments, and are either not described or described only briefly. FIG. 23 is a block diagram illustrating the function of the imaging system according to the present embodiment.

The imaging devices 100 described in the first to fifth embodiments are applicable to various imaging systems. Imaging systems to which the imaging device 100 is applicable include, but are not limited to, a digital still camera, a digital camcorder, a surveillance camera, a copier, a facsimile machine, a mobile phone, a car-mounted camera, and an observation satellite. The imaging systems also include a camera module having an optical system, such as lenses, and an imaging device. FIG. 23 illustrates a block diagram of a digital still camera as an example.

An imaging system 300 exemplified in FIG. 23 includes the imaging device 100, a lens 302 that forms an optical image of an object onto the imaging device 100, an aperture 304 that varies the amount of light passing through the lens 302, and a barrier 306 that protects the lens 302. The lens 302 and the aperture 304 form an optical system for focusing light onto the imaging device 100. The imaging device 100 is any of the imaging devices 100 described in the first to fifth embodiments, and converts the optical image formed by the lens 302 into image data.

The imaging system 300 also includes a signal processing unit 308 that processes signals output from the imaging device 100. The signal processing unit 308 performs AD conversion to convert analog signals output from the imaging device 100 to digital signals. The signal processing unit 308 outputs the image data after performing other necessary processing such as correction and compression. An AD converter, which is part of the signal processing unit 308, may be formed on the semiconductor substrate on which the imaging device 100 is disposed, or on another semiconductor substrate different from that for the imaging device 100. The imaging device 100 and the signal processing unit 308 may be formed on the same semiconductor substrate.

The imaging system 300 further includes a general control/operation unit 318 that performs various arithmetic operations and controls the general operation of the digital still camera and a timing generation unit 320 that outputs various timing signals to the imaging device 100 and the signal processing unit 308. The timing signals and the like may be input from the outside, and the imaging system 300 only has to have the imaging device 100 and the signal processing unit 308 that processes signals output from the imaging device 100.

The imaging system 300 further includes a memory unit 310 that stores image data temporarily and an external interface (IF) unit 312 that allows communication with an external computer or the like. The imaging system 300 also includes a storage medium 314, such as a semiconductor memory, onto which to record or from which to read imaged data and a storage medium control interface (IF) unit 316 that records imaged data onto the storage medium 314 or reads imaged data from the storage medium 314. The storage medium 314 may be incorporated in the imaging system 300 or may be detachable.

The imaging device 100 outputs image signals (A+B-signals) and focus detection signals (A-signals and B-signals) to the signal processing unit 308. The signal processing unit 308 generates image data by performing predetermined signal processing on the image signals output from the imaging device 100. The signal processing unit 308 also detects whether the image is in focus using the focus detection signals. When the signal processing unit 308 detects that the image is not in focus, the general control/operation unit 318 drives the optical system in the direction for making the image in focus. The signal processing unit 308 detects again whether the image is in focus using the focus detection signals output from the imaging device 100. The imaging device 100, the signal processing unit 308, and the general control/operation unit 318 iterates this operation until the image is in focus. To obtain a wide dynamic-range image, the general control/operation unit 318 combines image data based on short accumulation signals and image data based on long accumulation signals.

An imaging system employing the imaging device 100 according to any of the first to fifth embodiments can acquire moving images with a wide dynamic range while performing high-speed, fine autofocus.

[Modification]

The present invention is not limited to the above embodiments and can be modified variously.

For example, the imaging devices in the above embodiments use the photoelectric conversion units D1, D2 that generate electrons as signal charges, but the present invention may be applied similarly to an imaging device using the photoelectric conversion units D1, D2 that generate holes as signal charges. In this case, the conductivity types of the transistors forming the pixel 12 are inverted. The source and drain of each transistor described in the embodiment may be called by different names depending on the conductivity type of the transistor, the function being focused on, or the like, and the source and drain of some or all of the transistors described above may be called by the opposite names.

The pixels 12 in the above embodiments each have two photoelectric conversion units D1, D2, but may include more than two photoelectric conversion units instead. Moreover, each pixel 12 does not necessarily have to have more than one photoelectric conversion unit, and each pixel 12 may be configured to receive light of a different pupil-divided area by, for example, a light shielding film covering the photoelectric conversion unit from above.

The imaging system described in the sixth embodiment is an example of an imaging system to which the imaging device of the present invention is applicable, and an imaging system to which the imaging device of the present invention is applicable is not limited to the configuration illustrated in FIG. 16.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-115946, filed Jun. 10, 2016, which is hereby incorporated by reference herein in its entirety.

What is claimed is:
1. An imaging device comprising:
a plurality of pixels each including a first photoelectric conversion unit on which a first part of pupil-divided incident light is incident; a second photoelectric conversion unit on which a second part of the pupil-divided incident light is incident; a first holding unit that holds charges transferred from the first photoelectric conversion unit and the second photoelectric conversion unit; and an amplifier unit that outputs a signal based on an amount of the charges held by the first holding unit, wherein
each of the plurality of pixels is configured to output a first signal based on an amount of charges generated by the first photoelectric conversion unit during a first exposure time, a second signal based on an amount of charges generated by the first photoelectric conversion unit and the second photoelectric conversion unit during the first exposure time, a third signal based on an amount of charges generated by the first photoelectric conversion unit during a second exposure time, which is shorter than the first exposure time, and a fourth signal based on an amount of charges generated by the first photoelectric conversion unit and the second photoelectric conversion unit during the second exposure time, and
in a certain one of frames, the first and second signals are output before the third and fourth signals, and in another one of the frames, the first and second signals are output after the third and fourth signals.
2. The imaging device according to claim 1, wherein
an interval between a timing to output the first signal and a timing to output the third signal is different between the frames.
3. The imaging device according to claim 2, wherein
in the frame in which the third and fourth signals are output before the first and second signals, an interval between a timing to output the third signal and a timing to output the first signal is longer than a half period of the frame.
4. The imaging device according to claim 1, wherein
each of the plurality of pixels further includes
a second holding unit that is provided between the first photoelectric conversion unit and the first holding unit and holds charges transferred from the first photoelectric conversion unit, and
a third holding unit that is provided between the second photoelectric conversion unit and the first holding unit and holds charges transferred from the second photoelectric conversion unit, and
transfer of the charges from the first photoelectric conversion unit to the second holding unit and transfer of the charges from the second photoelectric conversion unit to the third holding unit are performed simultaneously in the plurality of pixels.
5. The imaging device according to claim 1, wherein
in a frame in which the first and second signals are output first among the first and second signals and the third and fourth signals, the third signal is not output, and only the fourth signal is output.
6. The imaging device according to claim 1, wherein
in a frame in which the third and fourth signals are output first among the first and second signals and the third and fourth signals, the first signal is not output, and only the second signal is output.
7. The imaging device according to claim 1, wherein
whether to output the first and second signals first or to output the third and fourth signals first in a certain frame is determined based on a signal in a previous frame.
8. The imaging device according to claim 1, wherein
among the first and second signals and the third and fourth signals, signals output first in each frame are used for focus detection, and
the second signal and the third signal are used for high dynamic range imaging.
9. The imaging device according to claim 1, wherein
the plurality of pixels are arranged in a plurality of rows,
the plurality of rows includes
a plurality of first rows each including the pixels that output the first signal, the second signal, the third signal, and the fourth signal, and
a plurality of second rows each including the pixels that output only the second signal and the fourth signal, and
readout from the pixels in the plurality of first rows are performed before readout from the pixels in the plurality of second rows.
10. The imaging device according to claim 1, further comprising:
a control signal supplying unit that supplies, to the plurality of pixels, control signals for outputting the first signal, the second signal, the third signal, and the fourth signal.
11. An imaging system comprising:
an imaging device according to claim 1; and
a signal processing unit that processes signals output from the imaging device.
12. An imaging device comprising:
a plurality of pixels each including a first photoelectric conversion unit on which a first part of pupil-divided incident light is incident; a second photoelectric conversion unit on which a second part of the pupil-divided incident light is incident; a first holding unit and a second holding unit that hold charges transferred from the first photoelectric conversion unit; a third holding unit and a fourth holding unit that hold charges trans- ferred from the second photoelectric conversion unit; a fifth holding unit that holds charges transferred from the first holding unit and the third holding unit; a sixth holding unit that holds charges transferred from the second holding unit and the fourth holding unit; a first amplifier unit that outputs a signal based on an amount of the charges held by the fifth holding unit; and a second amplifier unit that outputs a signal based on an amount of the charges held by the sixth holding unit, wherein the first holding unit is configured to hold charges generated by the first photoelectric conversion unit during a first exposure period, the second holding unit is configured to hold charges generated by the first photoelectric conversion unit during a second exposure period, which is shorter than the first exposure period, the third holding unit is configured to hold charges generated by the second photoelectric conversion unit during the first exposure period, and the fourth holding unit is configured to hold charges generated by the second photoelectric conversion unit during the second exposure period, and each of the plurality of pixels is configured to output a first signal based on an amount of the charges generated by the first photoelectric conversion unit during the first exposure period, a second signal based on an amount of the charges generated by the first photoelectric conversion unit and the second photoelectric conversion unit during the first exposure period, a third signal based on an amount of the charges generated by the first photoelectric conversion unit during the second exposure period, and a fourth signal based on an amount of the charges generated by the first photoelectric conversion unit and the second photoelectric conversion unit during the second exposure period.

13. The imaging device according to claim 12, wherein the first and third signals are output simultaneously, and the second and fourth signals are output simultaneously.

14. The imaging device according to claim 12, wherein each of the plurality of pixels further includes
a first charge draining transistor connected to the first photoelectric conversion unit; and
a second charge draining transistor connected to the second photoelectric conversion unit.

15. The imaging device according to claim 12, wherein a temporal center of the first exposure period and a temporal center of the second exposure period coincide with each other.

16. The imaging device according to claim 12, wherein among the first and second signals and the third and fourth signals, signals output first in each frame are used for focus detection, and the second signal and the third signal are used for high dynamic range imaging.

17. The imaging device according to claim 12, wherein the plurality of pixels are arranged in a plurality of rows, the plurality of rows includes
a plurality of first rows each including the pixels that output the first signal, the second signal, the third signal, and the fourth signal, and
a plurality of second rows each including the pixels that output only the second signal and the fourth signal, and
readout from the pixels in the plurality of first rows are performed before readout from the pixels in the plurality of second rows.

18. The imaging device according to claim 12, further comprising:
a control signal supplying unit that supplies, to the plurality of pixels, control signals for outputting the first signal, the second signal, the third signal, and the fourth signal.

19. An imaging system comprising:
an imaging device according to claim 12; and
a signal processing unit that processes signals output from the imaging device.

20. A method for driving an imaging device including a plurality of pixels each including a first photoelectric conversion unit on which a first part of pupil-divided incident light is incident, a second photoelectric conversion unit on which a second part of the pupil-divided incident light is incident, a first holding unit that holds charges transferred from the first photoelectric conversion unit and the second photoelectric conversion unit, and an amplifier unit that outputs a signal based on an amount of the charges held by the first holding unit, the method comprising:
outputting a first signal based on an amount of charges generated by the first photoelectric conversion unit during a first exposure time;
outputting a second signal based on an amount of charges generated by the first photoelectric conversion unit and the second photoelectric conversion unit during the first exposure time;
outputting a third signal based on an amount of charges generated by the first photoelectric conversion unit during a second exposure time, which is shorter than the first exposure time; and
outputting a fourth signal based on an amount of charges generated by the first photoelectric conversion unit and the second photoelectric conversion unit during the second exposure time, wherein
the first and second signals are output before the third and fourth signals in a certain one of frames, and output after the third and fourth signals in another one of the frames.

* * * * *